United States Patent [19]

Shono et al.

[11] Patent Number: 5,449,934

[45] Date of Patent: * Sep. 12, 1995

[54] SEMICONDUCTOR MEMORY DEVICE AND PROCESS

[75] Inventors: Tomofumi Shono; Teruhito Ohnishi; Masanori Fukumoto, all of Osaka, Japan

[73] Assignee: Matsushita Electric Industrial Co., Ltd., Osaka, Japan

[*] Notice: The portion of the term of this patent subsequent to Nov. 15, 2011 has been disclaimed.

[21] Appl. No.: 235,710

[22] Filed: Apr. 29, 1994

Related U.S. Application Data

[63] Continuation of Ser. No. 19,577, Feb. 18, 1993, Pat. No. 5,365,095.

[30] Foreign Application Priority Data

Feb. 18, 1992 [JP] Japan .................. 4-030451
Aug. 25, 1992 [JP] Japan .................. 4-225593
Dec. 3, 1992 [JP] Japan .................. 4-324208

[51] Int. Cl.⁶ .................. H01L 27/02; H01L 23/48; H01L 29/40
[52] U.S. Cl. .................. 257/295; 257/296; 257/297
[58] Field of Search .................. 257/295, 296, 297

[56] References Cited

U.S. PATENT DOCUMENTS 4,937,645  6/1990  Ootsuka et al. .................. 357/42
5,095,346  3/1992  Bae et al. .................. 357/23.6
5,365,095 11/1994  Shono et al. .................. 257/295

FOREIGN PATENT DOCUMENTS 2-137363  5/1990  Japan .
3-256358 11/1991  Japan .
3-297166 12/1991  Japan .

Primary Examiner—Sara W. Crane
Assistant Examiner—Stephen D. Meier
Attorney, Agent, or Firm—Willian Brinks Hofer Gilson & Lione

[57] ABSTRACT

A semiconductor memory device with a storage capacitor is provided which accomplishes a large storage capacity together with a high component density, and facilitates the production. A switching transistor is formed locally in a semiconductor substrate. Formed over the transistor is an upper-level wire disposed over which is a storage capacitor. A storage capacitor contact passes through the upper-level wire. While ensuring a good capacity for the storage capacitor contact, the allowance of focus, too, can advantageously be obtained in simultaneously transferring a pattern of the upper-level wire onto the memory cell region as well as onto the peripheral circuit region. Particularly, by having the storage capacitor contact pass through a bit line, a drain and a source can symmetrically be arranged with a word line, like a memory cell with a bit-line-over-storage-capacitor organization cell. This eliminates an excess portion resulting in increasing the density.

2 Claims, 22 Drawing Sheets

1 2,4 9 2,3 8 6 5

13 11 12 10
7

17
16
15
14

18 19

20 21 22

SEMICONDUCTOR MEMORY DEVICE AND PROCESS

This is a continuation of application Ser. No. 08/019,577, filed Feb. 18, 1993, now U.S. Pat. No. 5,365,095.

BACKGROUND OF THE INVENTION

This is an invention that generally relates to semiconductor memory devices. More specifically, this invention pertains to a dynamic random access memory called DRAM, and to a method of manufacturing it.

Various attempts have been made to increase the density of memory devices on the small area of a semiconductor memory chip. For example, there is a known fabrication technique in which, in order to minimize a memory cell area to increase the density of semiconductor memory devices, the storage capacitor is formed over the transistor serving as a switch. Two types of memory cells are known, one in which the bit line is formed over the storage capacitor which is thus called the "bit-line-over-storage-capacitor organization cell" (hereinafter referred to as the "BLOSC" organization cell) and the other in which the bit line is formed under the storage capacitor which is thus called the "bit-line-under-storage-capacitor organization cell" (the BLUSC organization cell).

An example of prior art semiconductor memory devices is described below.

FIG. 20 shows the cross section of a conventional semiconductor memory device employing the BLUSC organization cell, and FIG. 21 shows the corresponding layout. The body of this prior art semiconductor memory device is composed of a p-type semiconductor substrate 1, an ion diffused layer 2 made up of a drain 8 and a source 4 both formed locally in the p-type semiconductor substrate 1, an isolation region 5 that is used for electrical insulation from the neighboring ion diffused layer 2, a word line 8, a gate oxide 7, and a gate 8 that is part of the word line 8 lying over the gate oxide 7. The drain 8, the source 4, and the gate 8 together constitute a switching transistor 9. A first dielectric layer 10 is formed of BPSG (B,P-doped $SiO_2$). A bit line contact 11 is formed on the drain 3. A bit line 12 is formed of $n^+$ polysilicon and $WSi_{2.7}$. The bit line 12 is electrically connected to the drain 8 through the bit line contact 11. A second dielectric layer 13 is formed of BPSG. A storage capacitor contact 18 is formed on the source 4. A storage capacitor electrode 20, of $n^+$ polysilicon, is electrically connected to the source 4 via the storage capacitor contact 18. A capacitor insulation layer 21 is of a multilayered structure formed of layers of $SiO_2$ and $Si_3N_4$. A plate electrode 22 is formed of $n^+$ polysilicon which, together with the storage capacitor electrode 20 and the capacitor insulation layer 21, constitutes a storage capacitor 28. A third dielectric layer 15 is formed of BPSG. A first upper-level wire 14 is of a multilayered structure formed of layers of Ti, TiN, and AlSiCu (Si, Cu-doped Al). A fourth dielectric layer 17 is formed of $SiO_2$ formed by decomposing tetraethylorthosilicate (abbreviated TEOS), $Si(OC_2H_5)_4$. A second upper-level wire 16 is of a multilayered structure formed of layers of Ti, TiN, and AlSiCu.

FIG. 22 is a schematic top section of a conventional semiconductor memory device with the BLOSC organization cell, and like elements are indicated by like reference numerals throughout the figures.

Due to the foregoing organization, the following drawbacks arise.

In the first place, since the peripheral circuit region does not have the storage capacitor 23, the substrate height of the upper-level wire greatly varies between the peripheral circuit region and the memory cell region. This presents a problem that the allowance of focus decreases during the patterning for transferring a pattern of the upper-level wire onto the memory cell region and the peripheral circuit region at the same time by means of a photolithographic process.

In the second place, following the step of forming the storage capacitor 28, the substrate of the first upper-level wire 14 is leveled with a high-temperature heat treatment. This prevents not only the use of a high dielectric layer formed of such a material of $TaO_x$ whose dielectric characteristic is degraded when treated at high temperatures but also the use of a strong dielectric layer formed of such a material as PZT(Pb $(Zr_xTi_{1-x})O_3$), as the material for the capacitor insulation layer 21 of the storage capacitor 23.

In the last place, in the semiconductor memory device of the BLOSC organization of FIG. 22, the bit line contact 11, which connects the bit line 12 lying over the storage capacitor electrode 20 to the drain 8 of the switching transistor 9 lying under the storage capacitor electrode 20, and the storage capacitor electrode 20 coexist in the same layer. Thus, the area of the storage capacitor electrode 20 is reduced by the area occupied by the bit line contact 11. This leads to the decrease of the capacitance of the storage capacitor, compared to the BLUSC organization cell of FIG. 21. In the semiconductor memory device with the BLUSC organization cell, on the other hand, the bit line contact 11 for connection between the bit line 12 and the drain 8 must be provided under the bit line 12, and the storage capacitor contact 18 for connection between the storage capacitor electrode 20 and the source 4 must be provided beside the bit line 12. As a result, the drain 3 and the source 4 are asymmetrical with the word line 6. Due to this, the area of the ion diffused layer 2 excessively increases by the area of a portion 30 of FIG. 21, compared to the BLOSC organization cell where the drain 3 and the source 4 are symmetrical in relation to the word line 6. As a result, the area per unit cell disadvantageously increases as compared to the BLOSC organization cell thereby preventing the density of semiconductor memory devices from increasing.

Japanese Patent Application published under Pub. No. 2-137363 meanwhile discloses a technique for increasing the capacity of storage capacitors. In this prior art technique, two storage capacitors, with intervening a dielectric layer between them, are provided thereby attempting to increase the capacity without increasing the size of semiconductor memory devices. This, however, presents a problem that the provision of such two storage capacitors in the two layers results in the increase of thickness to upper-level wiring. This also allows for the allowance of focus to decrease during the photolithographic process.

SUMMARY OF THE INVENTION

Therefore, it is an object of the invention to increase the allowance of focus during carrying out a photolithographic process for patterning of the first and second upper-level wires.

It is another object of the invention to allow the use of a high dielectric layer of such a material as $TaO_x$ that has poor resistance against high-temperature treatment, or the use of a strong dielectric layer of such a material as PZT, as a capacitor insulation layer.

It is still another object of the invention to increase the area of the storage capacitor, as achieved in a memory cell with the BLUSC organization, and to decrease the area of the ion diffused layer per unit cell, as achieved in a memory cell with the BLOSC organization.

BRIEF DESCRIPTION OF THE PREFERRED EMBODIMENTS

In the invention, a semiconductor memory device is provided which comprises a switching transistor that is locally formed in a semiconductor substrate having an ion diffused layer near a surface thereof, the ion diffused layer serving as a source, a drain, or the like constituents, an upper-level wire that is formed over the switching transistor, and a storage capacitor that is formed over the upper-level wire. The storage capacitor of the memory cell region of the semiconductor substrate is located over the upper-level wire. This improves the allowance of focus during carrying out a photolithographic process for simultaneously patterning the upper-level wire on the memory cell region as well as on the peripheral circuit region because the same substrate height can be obtained at these two regions, and further increases the area of the storage capacitor.

In the invention, another semiconductor memory device is provided wherein a capacitor insulation layer of the storage capacitor is comprised of a strong dielectric layer formed of materials such as PZT thereby making it possible to form the storage capacitor after leveling a base for the upper-level wire by a high-temperature treatment while at the same time enjoying a good charge hold characteristic. Therefore, this prevents the degradation of the strong dielectric characteristics of the capacitor insulation layer due to high-temperature treatments.

In the invention, still another semiconductor memory device is provided wherein a storage capacitor contact, which brings the storage capacitor into contact with an ion diffused layer of the switching transistor, is formed in such a manner that the storage capacitor contact passes through the upper-level wire. The storage capacitor contact is so formed that it passes through the upper-level wire thereby improving the degree of freedom for plane arrangement of the storage capacitor contact and the upper-level wire.

In the invention, a method of manufacturing a semiconductor memory device is provided which comprises the steps of forming a switching transistor locally in a semiconductor substrate, forming an upper-level wire over the switching transistor, and forming a storage capacitor over the upper-level wire. The storage capacitor of the memory cell region of the semiconductor substrate is located over the upper wire. This improves the allowance of focus during carrying out a photolithographic process for simultaneously patterning the upper-level wire on the memory cell region as well as on the peripheral circuit region because the same substrate height can be obtained at these two regions, and further increases the area of the storage capacitor.

In the invention, another method of manufacturing a semiconductor memory device is provided wherein a capacitor insulation layer of the storage capacitor is formed of a strong dielectric material, and the step of forming the storage capacitor is carried out after a high-temperature treatment for leveling a base for the upper-level wire. The formation of the storage capacitor is carried out after a high-temperature treatment for leveling the upper-level wire base. Accordingly, a good charge hold characteristic can be obtained without any degradation of the strong dielectric characteristics of the capacitor insulation layer due to high-temperature treatments even if the capacitor insulation layer of the storage capacitor is formed of a strong dielectric layer.

In the invention, a further method of manufacturing a semiconductor memory device is provided which includes the step of forming a storage capacitor contact, which brings the storage capacitor into contact with an ion diffused layer of the switching transistor, in such a manner that the storage capacitor contact passes through the upper-level wire. The storage capacitor contact is so formed that it passes through the upper-level wire thereby improving the degree of freedom for plane arrangement of the storage capacitor contact and the upper-level wire.

In the invention, a semiconductor memory device is provided which comprises a switching transistor that is locally formed in a semiconductor substrate, a bit line that is formed over the switching transistor, and a storage capacitor that is formed over the bit line, wherein a storage capacitor contact, which brings the storage capacitor into contact with an ion diffused layer of the switching transistor, is formed in such a manner that the storage capacitor contact passes through the bit line. In spite of employing the BLUSC organization here, it is possible to symmetrically arrange the drain and the source with the word line because the storage capacitor contact is formed to pass through the bit line. Thus, like the BLOSC organization, the area of the ion diffused layer per unit cell reduces whereby the density of semiconductor memory devices can be increased while ensuring the area of the storage capacitor as great as possible.

In the invention, another semiconductor memory device is provided wherein the storage capacitor contact, which brings the storage capacitor into contact with the ion diffused layer of the switching transistor, is formed in such a manner that the storage capacitor contact passes through a bit line. The density of semiconductor memory devices can be increased, accordingly.

In the invention, a method of manufacturing a semiconductor memory device is provided which comprises the steps of forming a switching transistor locally in a semiconductor substrate, forming a bit line over the switching transistor, forming a storage capacitor over the bit line, and forming a storage capacitor contact, which brings the storage capacitor into contact with an ion diffused layer of the switching transistor, in such a manner that the storage capacitor contact passes through the bit line. This achieves a greater storage capacity and a higher density.

In the invention, another method of manufacturing a semiconductor memory device is provided wherein the storage capacitor contact, which brings the storage capacitor into contact with the ion diffused layer of the switching transistor, is so formed that the storage capacitor contact passes through the bit line. This achieves a higher density.

In the invention, a semiconductor memory device is provided which comprises a switching transistor that is locally formed in a semiconductor substrate, a bit line that is formed over the switching transistor, and a storage capacitor that is formed over the bit line, wherein a storage capacitor contact, which brings the storage capacitor into contact with an ion diffused layer of the switching transistor, is formed in such a manner that, at a point where the storage capacitor contact and the bit line cross, only a portion of the storage capacitor contact passes through the bit line while on the other hand the remaining portion thereof passes through outside the bit line. Although a part of the storage capacitor contact passes through the bit line, the remaining passes through outside the bit line. The area of the bit line next to the storage capacitor contact decreases. Accordingly, the parasitic capacitance decreases, the area of the storage capacitor is adequately ensured, and the density of semiconductor memory devices increases.

In the invention, a further semiconductor memory device is provided wherein a storage capacitor contact, which brings the storage capacitor into contact with an ion diffused layer of the switching transistor, is formed in such a manner that, at a point where the storage capacitor contact and a bit line cross, only a portion of the storage capacitor contact passes through the bit line while on the other hand the remaining portion thereof passes through outside the bit line. Accordingly, the parasitic capacitance decreases, the area of the storage capacitor is adequately ensured, and the density increases.

In the invention, a still further semiconductor memory device is provided wherein an extraction electrode is formed on the ion diffused layer to which at least the storage capacitor contact is connected, and the storage capacitor contact is connected to the ion diffused layer through the extraction electrode. The area of the bit line next to the storage capacitor contact decreases. Accordingly, the parasitic capacitance decreases. The target used in forming the storage capacitor contact is enlarged which ensures the connection between the storage capacitor and the ion diffused layer.

In the invention, a semiconductor memory device is provided wherein a capacitor insulation layer and a plate electrode in turn are formed on the extraction electrode, and the storage capacitor is formed in such a manner that the storage capacitor passes through the plate electrode through the capacitor insulation layer. Another storage capacitor is provided below the storage capacitor. This results in the increase of storage capacity.

In the invention, a method of manufacturing a semiconductor memory device is provided which comprises the steps of forming a switching transistor locally in a semiconductor substrate, forming a bit line over the switching transistor, forming a storage capacitor over the bit line, and forming a storage capacitor contact, which brings the storage capacitor into contact with an ion diffused layer of the switching transistor, in such a manner that, at a point where the storage capacitor contact and the bit line cross, only a portion of the storage capacitor contact passes through the bit line while on the other hand the remaining portion thereof passes through outside the bit line. Thus, the storage capacitor can be given a greater area, and a higher density as well as a smaller parasitic capacitance can be achieved.

In the invention, another method of manufacturing a semiconductor memory device is provided wherein a storage capacitor contact, which brings the storage capacitor into contact with an ion diffused layer of the switching transistor, is formed in such a manner that, at a point where the storage capacitor contact and the bit line cross, only a portion of the storage capacitor contact passes through the bit line while on the other hand the remaining portion thereof passes through outside the bit line. Thus, the storage capacitor can be given a greater area, and a higher density as well as a smaller parasitic capacitance can be achieved.

In the invention, still another method of manufacturing a semiconductor memory device is provided wherein an extraction electrode is formed on the ion diffused layer to which at least the storage capacitor contact is connected, and the storage capacitor contact is connected to the ion diffused layer through the extraction electrode. Thus, the storage capacitor can be given a greater area, and a higher density as well as a smaller parasitic capacitance can be achieved. The production of the semiconductor memory device having the forgoing advantages can be facilitated.

In the invention, a further method of manufacturing a semiconductor memory device is provided wherein a capacitor insulation layer and a plate electrode in turn are formed on the extraction electrode, and the storage capacitor is formed in such a manner that the storage capacitor passes through the plate electrode through the capacitor insulation layer. This facilitates the production of the semiconductor memory device with a greater storage capacity.

Other objects, features, and advantages will become more apparent to those skilled in the art from the following description when considered in conjunction with the appended claims and drawings.

BRIEF DESCRIPTION OF THE DRAWINGS

Referring to the drawings, wherein like reference numerals indicate like elements throughout the figures.

DETAILED DESCRIPTION OF THE INVENTION

Preferred examples of the invention are described by reference to the accompanying drawings.

FIRST EXAMPLE

Figure 1:
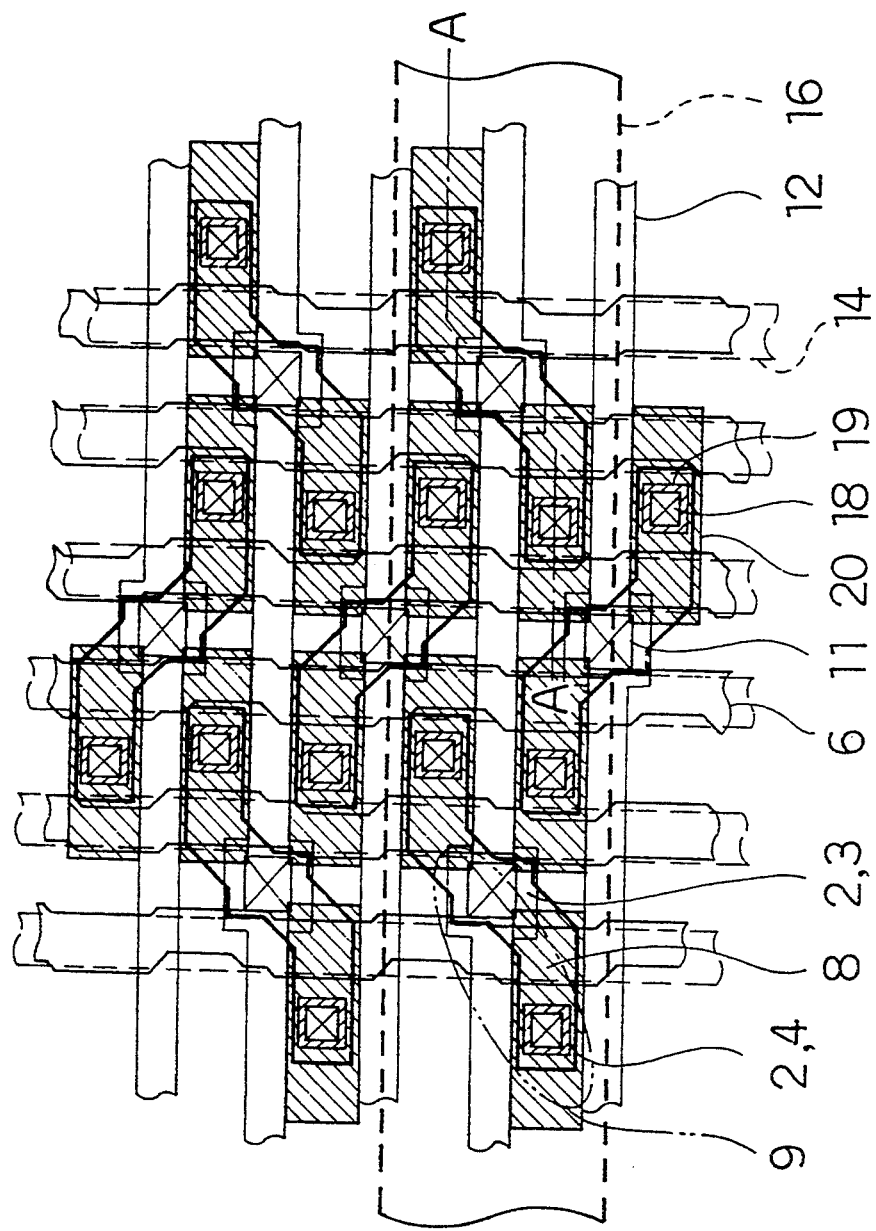
FIG. 1 is a schematic top view showing the layout of a semiconductor memory device of a first example of the present invention.
Figure 2:
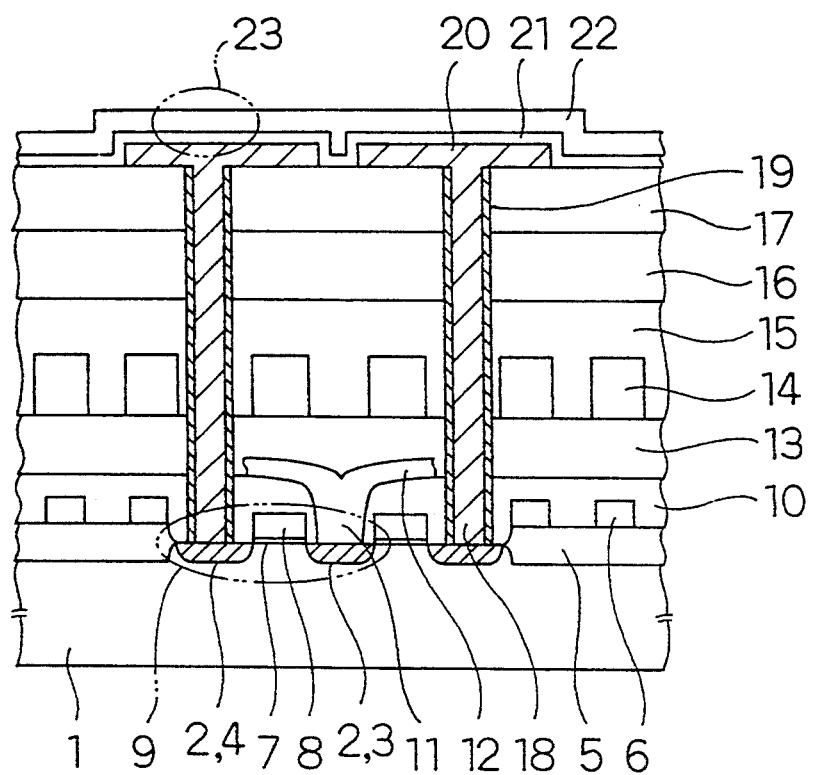
FIG. 2 is a cross sectional view through A—A of FIG. 1.

A first example of the invention is now described by reference to FIG. 1 that is a schematic top view illustrating the layout of a semiconductor memory device in accordance with the first embodiment. FIG. 2 is a cross sectional view through A—A of FIG. 1. Like characters indicate like elements throughout the figures. The semiconductor memory device of the invention has basically the same organization as the prior art semiconductor memory device. The switching transistor 9, formed locally in the p-type semiconductor substrate 1, has the same configuration as the foregoing conventional switching transistor. The first and second upper-level wires 14 and 16 are formed over the switching transistor 9. A sidewall passivation layer 19 is formed of low-temperature produced materials such as NSG (CVD (chemical vapor deposition)-formed $SiO_2$). The third dielectric layer 15 is formed of TEOS.

The invention is characterized in that the storage capacitor electrode 20, of n+ polysilicon, Ta, and Pt, is formed over the second dielectric layer 17, being brought into contact with the source 4 of the switching transistor 9 by way of the storage capacitor contact 18. The capacitor insulation layer 21 is formed of a strong dielectric substance, PZT.

Figure 8:
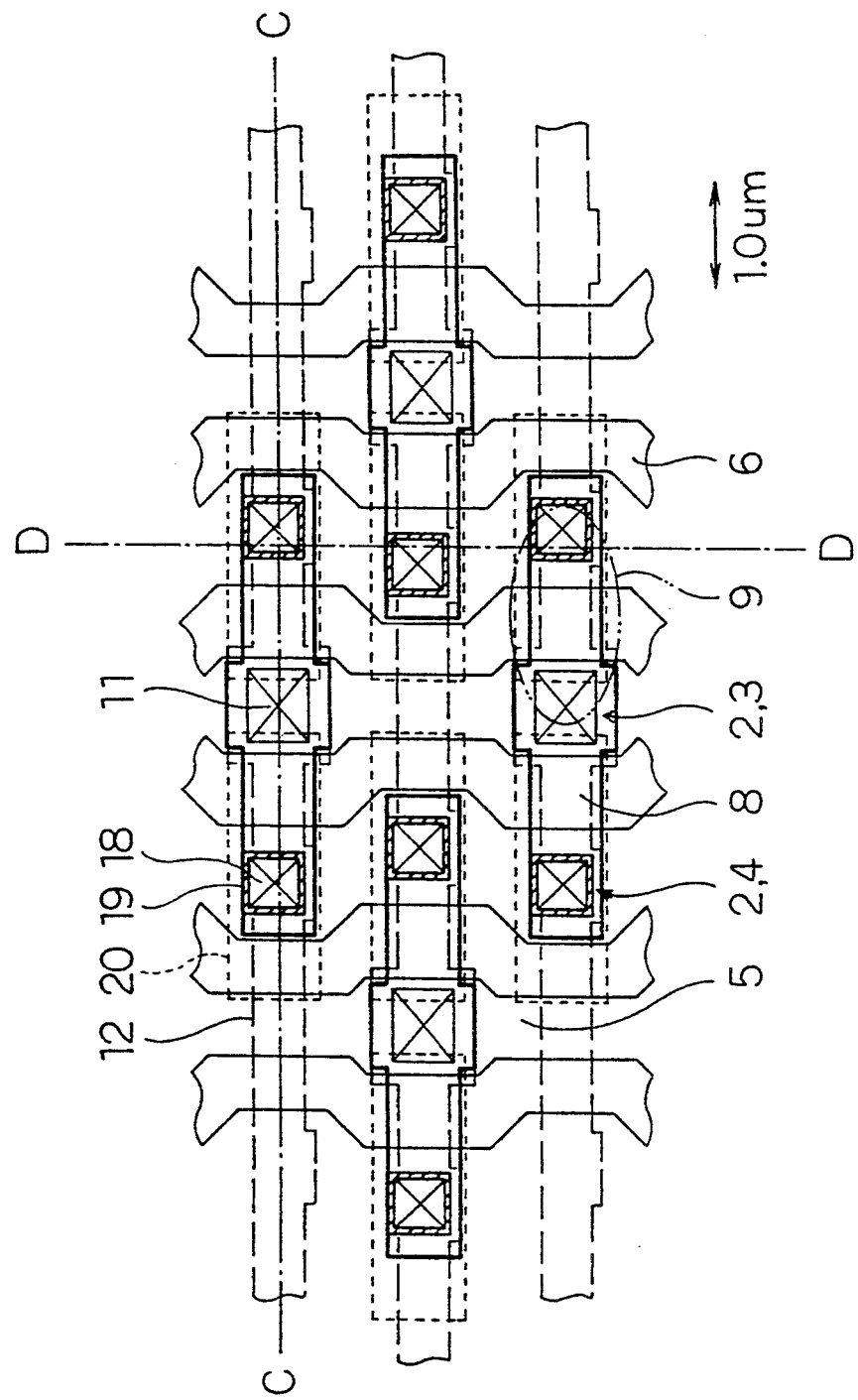
FIG. 8 is a schematic top view showing the layout of a semiconductor memory device of a third example of the present invention.

A method of manufacturing the semiconductor memory device of the first example is described by reference to FIG. 8.

Figure 3:
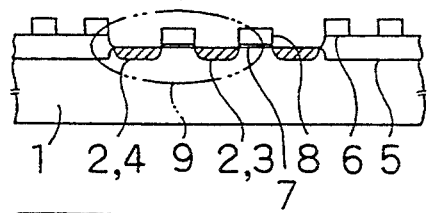
FIG. 3 illustrates the fabrication sequence of a semiconductor memory device of the first example of the invention.
Figure 3:
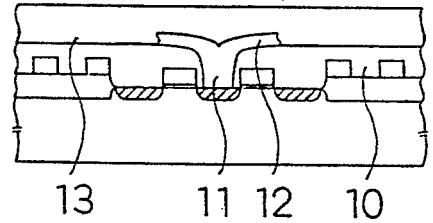
Figure 3:
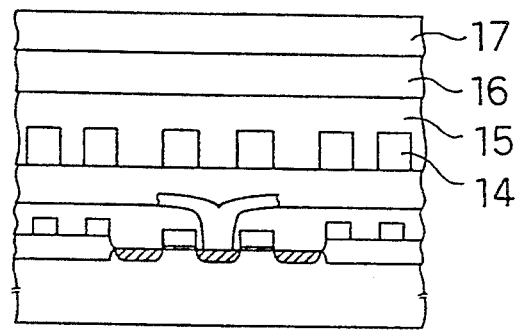
Figure 3:
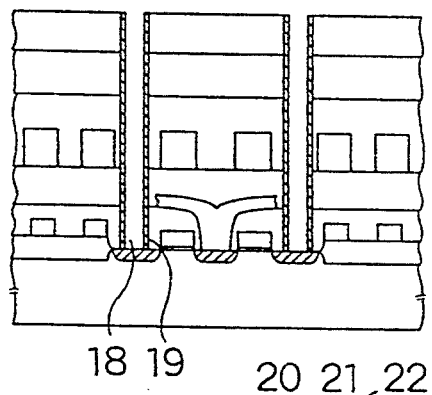
Figure 3:
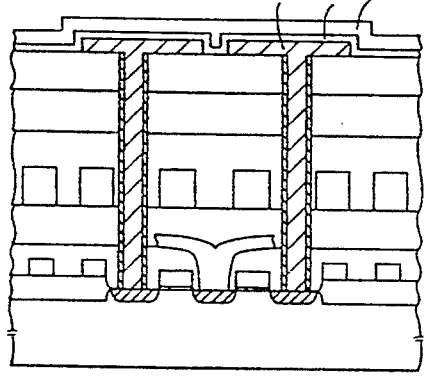

As shown in FIG. 3(a), formed by the known method on the p-type semiconductor substrate 1 are the ion diffused layer 2 composed of the drain 3 and the source 4, the isolation region 5 used for electrical insulation from the neighboring ion diffused layer 2, a word line 6, a gate insulation layer 7 between the drain 3 and the source 4, and a gate 8 on the gate insulation layer 7. The drain 3, the source 4, and the gate 8 together constitute the switching transistor 9.

As shown in FIG. 3(b), a layer of BPSG is deposited by means of atmospheric-pressure CVD (hereinafter referred to as "CVD"), to a thickness of about 400 nm. This deposited layer serves as the first dielectric layer 10. Then, the bit line contact 11 is formed on the drain 3 by means of photolithography and wet etching. Thereafter, a heat treatment is carried out for about 60 minutes at a temperature of about 900° C. to level the first dielectric layer 10. Next, a layer of polysilicon is deposited by low-pressure CVD (hereinafter referred to as "LPCVD"), to a thickness of about 90 nm. An implantation treatment is carried out in which arsenic is implanted at a dose of approximately $10^{15}$ per $cm^2$ at an implantation energy about 80 keV. Following the deposition of a layer of $WSi_{2.7}$ by sputtering to a thickness of about 200 nm, a resist pattern is formed by means of a photolithographic process. The deposited $WSi_{2.7}$, together with the deposited polysilicon, is etched by means of reactive-ion etching (RIE) to form the bit line 12 on the drain 3. Next, layers of NSG and BPSG are deposited by means of CVD to thicknesses of about 250 nm and 450 nm, respectively to form the second dielectric layer 13. Then a heat treatment is applied to the second dielectric layer 13 thus formed for about 30 minutes at a temperature of 900° C. to level it.

As shown in FIG. 3(c), layers of Ti, TiN, AlSiCu, and TiN are deposited by sputtering to thicknesses of about 25 nm, 100 nm, 700 nm, and 35 nm, respectively, before forming a resist pattern by a photolithographic process. These deposited layers of Ti, TiN, and AlSiCu are etched to form the first upper-level wire 14. A layer of TEOS is deposited by an LPCVD to a thickness of about 500 nm. The deposited TEOS is etched back about 100 nm by means of Ar sputtering. Another layer of TEOS is additionally deposited to a thickness of about 1600 nm to form the third dielectric layer 15. Then, a layer of photoresist is deposited to a thickness of about 800 nm. Using a photolithographic process the inverted pattern of the first upper-level wire 14 is formed. A further layer of photoresist is deposited to a thickness of about 1500 nm. Next, the deposited photoresist and TEOS are etched back to leave the TEOS with a thickness of about 800 nm whereby the third dielectric 15 is leveled. Following the deposition of layers of Ti, AlSiCu, and TiN to thicknesses of about 25 nm, 800 nm, and 35 nm, respectively by sputtering, a resist pattern is formed by a photolithographic process. These deposited layers of Ti, TiN, and AlSiCu are etched to form the second upper-level wire 16. A layer of TEOS is deposited by an LPCVD to a thickness of about 500 nm, thereafter the deposited TEOS being etched back about 100 nm by means of Ar sputtering. An additional layer of TEOS is deposited to a thickness of about 1600 nm to form the fourth dielectric layer 17. Then, a layer of photoresist is deposited to a thickness of about 800 nm. Using a photolithographic process the inverted pattern of the second upper-level wire 16 is formed. An additional layer of photoresist is deposited to a thickness of about 1500 nm. Next, the deposited photoresist and TEOS are etched back to leave the TEOS with a thickness of about 800 nm, to level the fourth dielectric layer 17.

As shown in FIG. 3(d), a resist patterns is defined over the source 4. With gasses, $CHF_3$, $O_2$, and $N_2$, the fourth dielectric layer 17, of TEOS, is etched. Thereafter, with gasses, $SiCl_4$, $Cl_2$, $CHCl_3$, and $N_2$, the second upper-level wire 16, of Ti, TiN and AlSiCu, is etched. Finally, with gasses, $CHF_3$ and $O_2$, the third dielectric layer 15, of TEOS, the second dielectric 13, of BPSG and NSG, and the first dielectric layer 10, of BPSG, are etched to form the storage capacitor contact 18. Then, a layer of NSG is deposited to a thickness of about 100 nm by an LPCVD. The deposited NSG is etched back with gasses, $CHF_3$ and $O_2$ by RIE to form on the sidewall of the storage capacitor contact 18 the sidewall passivation layer 19.

As shown in FIG. 3(e), through an LPCVD a layer of phosphorus-doped polysilicon is deposited to a thickness of about 300 nm. This phosphorus-doped polysilicon deposited is etched back by RIE so that it Is burled into inside the storage capacitor contact 18. Following the deposition of layers of Ta and Pt by sputtering to a thickness of 50 nm each, a resist pattern is formed by a photolithographic process. These deposited layers of Ta and Pt are etched by RIE to form the storage capacitor electrode 20. Then, by sputtering a layer of PZT is deposited to a thickness of about 100 nm. This deposited layer of PZT forms the capacitor insulation layer 21. Finally, a layer of TiN is deposited by sputtering to a thickness of about 100 nm to form the plate electrode 22.

In accordance with the first example of the invention, the switching transistor 9 is formed locally in the p-type semiconductor substrate 1, the first and second upper-level wires 14 and 16 are formed over the switching transistor 9, and the storage capacitor electrode 20 is formed over the second upper-level wire 16. Due to the above-described arrangement that the storage capacitor 23 of the memory cell region locates over the first and second upper-level wires 14 and 16, the same substrate height can be obtained in forming the first upper-level wire 14 or the second upper-level wire 16 in the memory cell region as well as in the peripheral circuit region. As a result of this, the allowance of focus increases when transferring a pattern of the first upper-level wire 14 or the second upper-level wire 16 onto the memory cell region as well as onto the peripheral circuit region at the same time by means of a photolithographic process.

The area of the storage capacitor electrode 20 can be increased, like the BLUSC organization, since the storage capacitor electrode 20 locates over the bit line 12.

Unlike this example where the storage capacitor contact 18 passes through the upper-level wire 18, the storage capacitor contact 18 above the second upper-level wire 18 may be formed without interference from the first upper-level wire 14 and the second upper-level wire 18. However, if the storage capacitor contact 18 is so formed that it runs through the second upper-level wire 18, this improves the degree of freedom for plane arrangement of the storage capacitor contact 18 and the second upper-level wire 16.

Additionally, since a high-temperature heat treatment for leveling the base of the first upper-level wire 14 is first carried out, and then the step of forming the storage capacitor 23 is carried out, this allows the use of high dielectric materials such as $TaO_x$ whose dielectric characteristic will be degraded when treated at high temperatures, or the use of ferroelectric materials such as PZT, as the material for the capacitor insulation layer 21 of the storage capacitor 23.

In the first example, the first and second upper-level wires 14 and 16 are a multilayered structure formed of layers of Ti, TiN, and AlSiCu, however, layers of Ti, TiN, and W, or layers of Ti, TiN, and $WSi_{2.7}$ may be employed to form the first and second upper-level wires 14 and 16. Further, in this example, the storage capacitor electrode 20 is formed by layers of phosphorus-doped polysilicon, Ta, and Pt, the capacitor insulation layer 21 is formed of PZT, and the plate electrode 22 is formed of TiN. However, the storage capacitor electrode 20 may be formed by phosphorus-doped polysilicon alone, the capacitor insulation layer 21 may be formed by layers of $SiO_2$ and $TaO_x$, and the plate electrode 22 may be formed by W. Alternatively, the storage capacitor electrode 20 may be formed by a layer of phosphorus-doped polysilicon alone, the capacitor insulation layer 21 may be formed by layers of $SiO_2$ and $Si_3N_4$, and the plate electrode 22 may be formed by phosphorus-doped polysilicon.

Figure 4:
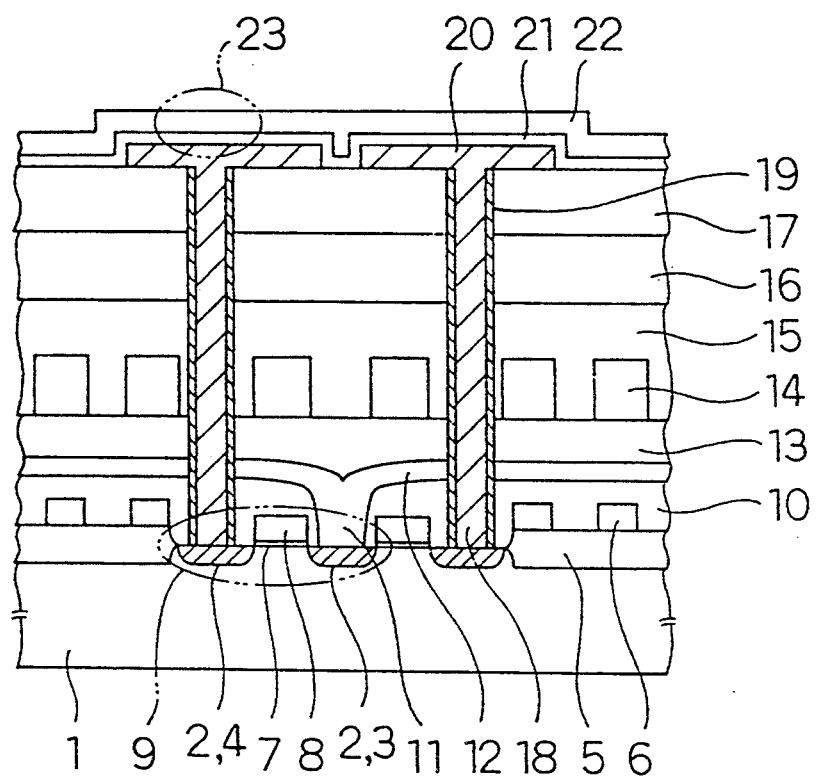
FIG. 4 is a cross sectional view illustrating the layout of a modification of the first example, which corresponds to FIG. 2.

Further, in the first example, it is possible to employ such a structure in which the storage capacitor contact 18 penetrates through the bit line 12, which is shown in FIG. 4. Also in this modification of the first example, within the storage capacitor contact 18, the source 4 and the storage capacitor electrode 20 are electrically isolated from the upper-level wires 14 and 16 and the bit line 12 by the presence of the sidewall passivation layer 19. As a result of this, like the following second example, the storage capacitor contact 18 can be formed by superposition on the bit line 12, and further the drain 8 and the source 4 can be arranged symmetrically with the word line 6.

Particularly, this modification can advantageously reduce the area of the ion diffused layer 2 per unit cell, like the BLOSC organization, compared to the first example. This result in a higher density.

SECOND EXAMPLE

Figure 5:
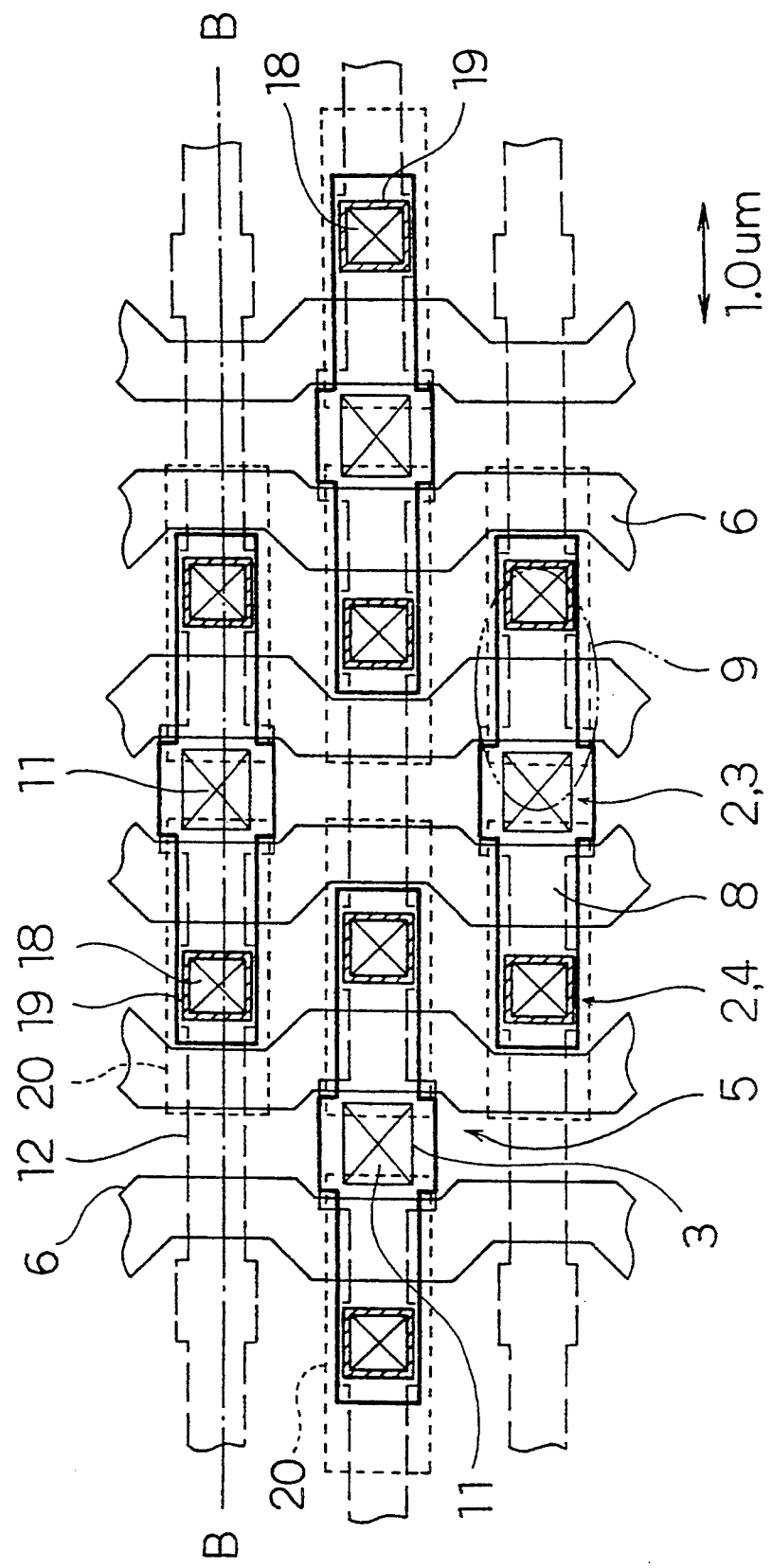
FIG. 5 is a schematic top view showing the layout of a semiconductor memory device of a second example of the present invention.
Figure 6:
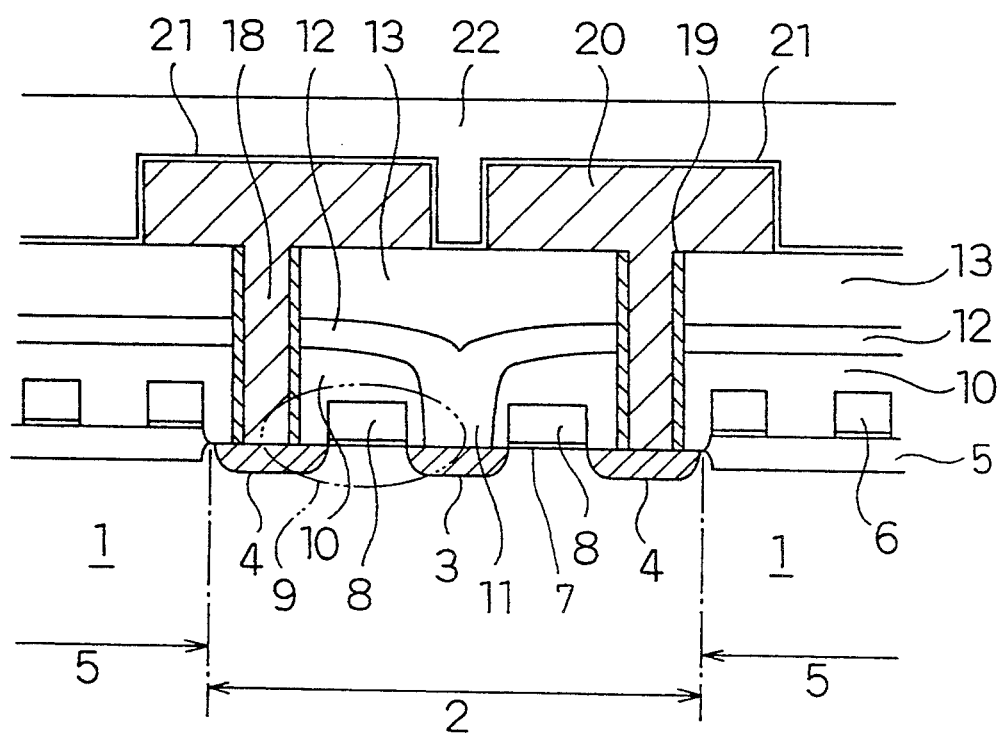
FIG. 6 is a cross sectional view through B—B of FIG. 5.

A second example of the invention is described below. FIG. 5 is a schematic top view showing the layout of a semiconductor memory device in accordance with the second example. FIG. 6 is a cross sectional view through B—B of FIG. 5. Like characters indicate like elements throughout the figures.

The bit line 12 is formed over the switching transistor 9. Formed over the bit line 12 is the storage capacitor electrode 20. The storage capacitor contact 18, which connects the storage capacitor electrode 20 to the source 4 of the switching transistor 9, is so formed that the contact 18 passes through the bit line 12. The sidewall passivation layer 19 of an insulation layer, of HTO (high-temperature produced $SiO_2$) and NSG which is an antioxidant preventing tungsten silicide from abnormally oxidizing at the time when a layer of HTO is being deposited, is formed on the sidewall of the storage capacitor contact 18.

The first and second upper-level wires 14 and 16 (not shown), previously described in the first example, are formed over the plate electrode 22 through dielectric layers.

Figure 7:
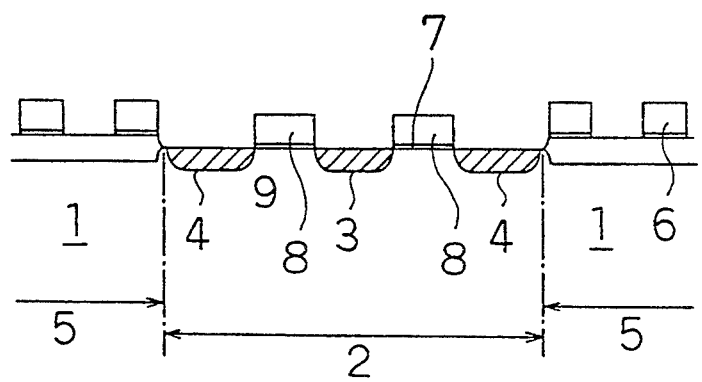
FIGS. 7a–7e illustrate the fabrication sequence of the semiconductor memory device of the second example.
Figure 7:
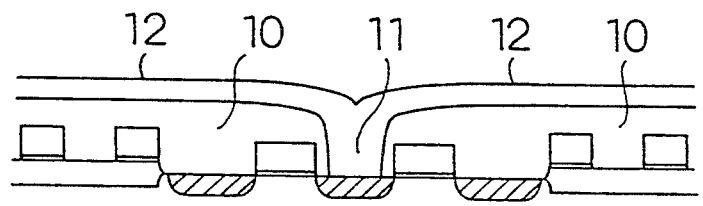
Figure 7:
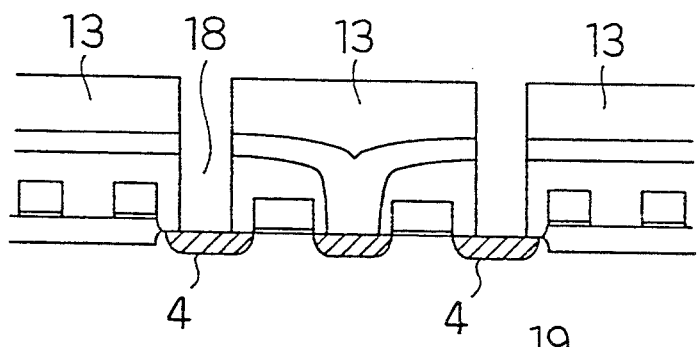
Figure 7:
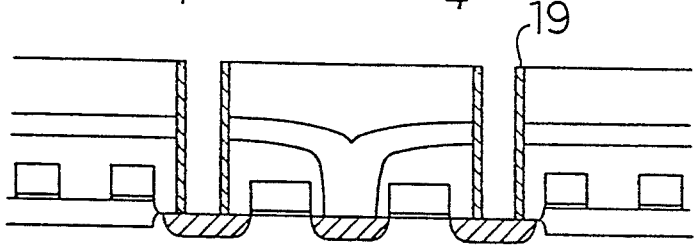
Figure 7:
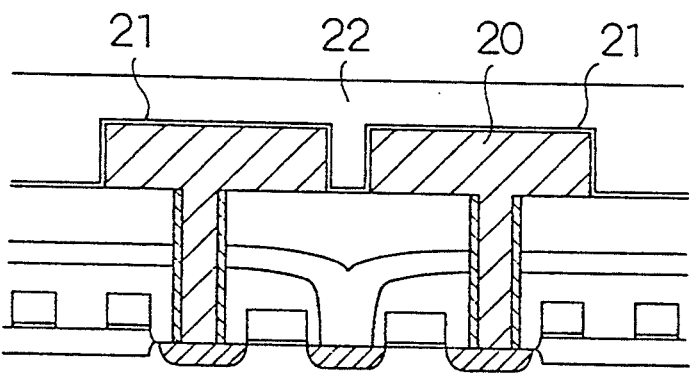

Reference is now made to FIG. 7 to describe a method of manufacturing the semiconductor memory device of the second example.

As shown in FIG. 7(a), formed by the known method on the p-type semiconductor substrate i are the ion diffused layer 2 composed of the drain 3 and the source 4, the isolation region 5 used for electrical insulation from the ion diffused layer 2, the word line 6, the gate insulation layer 7 between the drain 3 and the source 4, and the gate 8 on the gate insulation layer 7. The drain 3, the source 4, and the gate 8 together constitute the switching transistor 9.

As shown in FIG. 7(b), a layer of BPSG is deposited by means of a CVD to a thickness of about 400 nm. This deposited layer serves as the first dielectric layer 10. Then, the bit line contact 11 is formed on the drain 3 by means of photolithography and wet etching. Thereafter, a heat treatment is carried out for about 60 minutes at a temperature of about 900° C. to level the first dielectric layer 10. Next, a layer of polysilicon is deposited by an LPCVD to a thickness of approximately 90 nm. An implantation treatment is carried out in which arsenic is implanted at a dose of approximately $10^{15}$ per $cm^2$ at an implantation energy about 80 keV. Following the deposition of a layer of tungsten silicide by sputtering to a thickness of about 200 nm, a resist pattern is defined by means of a photolithographic process. The deposited layers of tungsten silicide and polysilicon are etched by means of RIE to form the bit line 12 on the drain 3, the bit line 12 parallelly running in the direction of the source 4.

As shown in FIG. 7(c), layers of NSG and BPSG are deposited by means of a CVD to thicknesses of about 250 nm and 450 nm, respectively to form the second dielectric layer 13. Then a heat treatment Is applied to the second dielectric layer 13 thus formed for about 30 minutes at a temperature of 900° C. to level it. Then a resist pattern is formed on the source 4. By using the resist pattern as a mask, the second dielectric layer 13, of BPSG, is etched with $CHF_3$ to expose the bit line 12, of tungsten silicide. Now with gases, HBr, HCl, and $SF_6$ the deposited layers of tungsten silicide and polysilicon are etched. Then, the first dielectric layer 10, of BPSG, is etched with $CHF_3$ to form the storage capacitor contact 18.

As shown in FIG. 7(d), by means of a CVD, layers of NSG and HTO are deposited to thicknesses of about 100 nm and 150 nm, respectively. These deposited layers of HTO and NSG are etched back with $CHF_3$ by RIE to form the sidewall passivation layer 19 on the sidewall of the storage capacitor contact 18.

As shown in FIG. 7(e), a layer of phosphorus-doped polysilicon is deposited by means of an LPCVD to a thickness of about 500 nm. A resist pattern is defined by a photolithographic process. Using the resist pattern as a mask, the deposited layer of phosphorus-doped silicon is etched by RIE to form the storage capacitor electrode 20. Next, a nitride film with a thickness of about 8.5 nm is deposited by an LPCVD. The nitride film is then thermal-oxidized at a temperature of about 850° C. for about 20 minutes to form the capacitor insulation layer 21. A layer of phosphorus-doped silicon is deposited to a thickness of about 250 nm to form the plate electrode 22.

As described above, the semiconductor memory device of the second example comprises the switching transistor 9, locally provided in the p-type semiconductor substrate 1, the bit line 12 formed over the switching transistor 9, and the storage capacitor electrode 20 formed over the bit line 12, wherein the storage capacitor contact 18, which brings the storage capacitor electrode 20 into contact with the source 4 of the switching transistor 9, is so formed that it (the contact 18) runs through the bit line 12, and the sidewall passivation layer 19 of an insulation layer, of HTO (high-temperature produced $SiO_2$) and NSG as an antioxidant that prevents tungsten silicide from abnormally oxidizing at the time when HTO is being deposited, is formed on the sidewall of the storage capacitor contact 18. As a result, the source 4 and the storage capacitor electrode 20 are electrically isolated from the bit line 12 by the presence of the sidewall passivation layer 19 so that the storage capacitor contact 18 can be formed by superposition on the bit line 12, and further the drain 8 and the source 4 can be arranged symmetrically with the word line 6.

This can advantageously reduce the area of the ion diffused layer per unit cell, as in the BLOSC organization. This results in a higher density of semiconductor memory devices. The area of the storage capacitor electrode 20 can be increased, since the storage capacitor electrode 20 is located over the bit line 12. More specifically, in the conventional memory cell with the BLUSC organization, the areas of the ion diffused layer and the unit cell are 1.86875 $\mu m^2$ and 4.48 $\mu m^2$ respectively while on the other hand in the second example of the invention they are 1.66 $\mu m^2$ and 4.27 $\mu m^2$. In other words, these areas, accomplished by the invention, are the same as those of the conventional memory cell with the BLOSC organization. Further, in the conventional memory cell with the BLOSC organization, the area of the storage capacitor electrode is 1.89 $\mu m^2$ while on the other hand in the second example of the invention it is expanded to 2.43 $\mu m^2$. That is, this area, accomplished by the invention, is the same as that of the conventional memory cell with the BLUSC organization. Accordingly, the present invention has both the advantage of the BLOSC organization cell and the advantage of the BLUSC organization cell.

THIRD EXAMPLE

Figure 9:
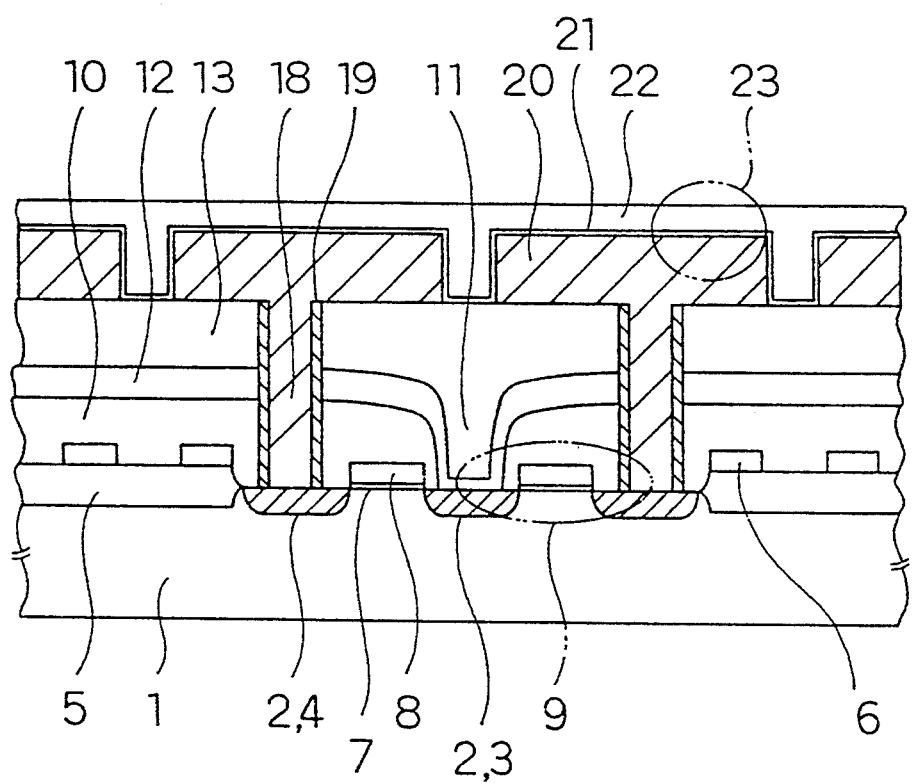
FIG. 9 is a cross sectional view through C—C of FIG. 8.
Figure 10:
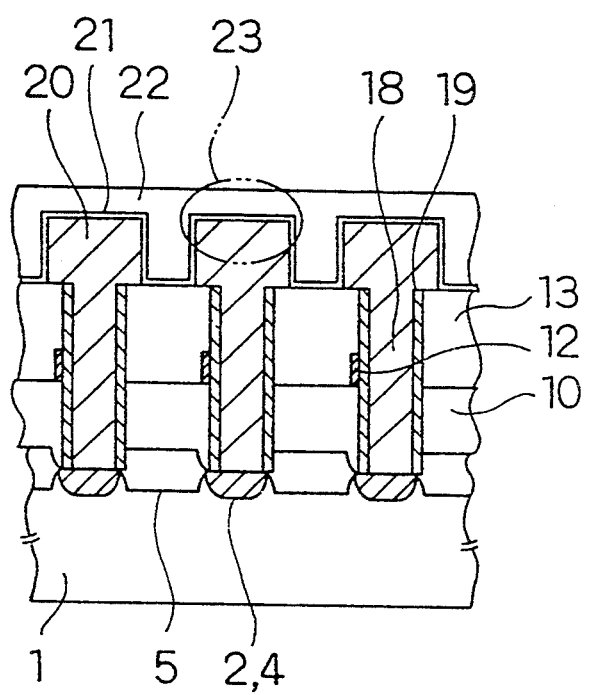
FIG. 10 is a cross sectional view through D—D of FIG. 8.

A third example of the invention is described below. FIG. 8 is a schematic top view showing the layout of a semiconductor memory device in accordance with the third example. FIG. 9 is a cross sectional view through C—C of FIG. 8. FIG. 10 is a cross sectional view through D—D of FIG. 8. Like characters indicate like elements throughout the figures.

The semiconductor memory device of the third example has roughly the same organization as the second example. In the third embodiment, however, the storage capacitor contact 18 is differently formed, that is to say, at a point where the storage capacitor contact 18 and the bit line 12 cross, only a part of the storage capacitor contact 18 passes through the bit line 12 while on the other hand the remaining part passes through outside the bit line 12.

Figure 11:
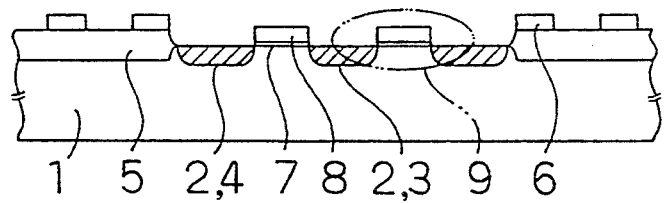
FIGS. 11a–11e illustrate the fabrication sequence of the semiconductor memory device of the third example.
Figure 11:
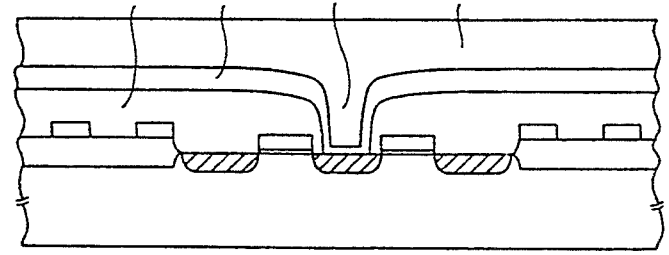
Figure 11:
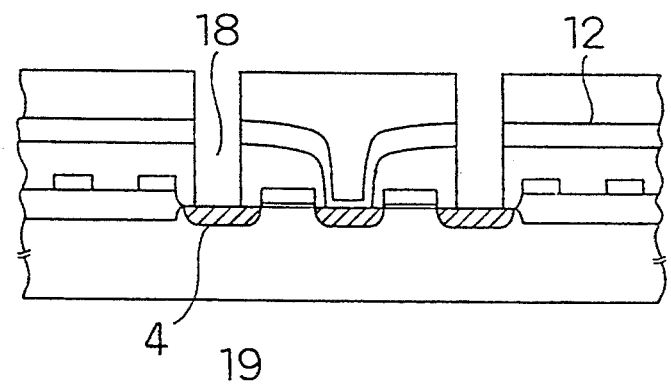
Figure 11:
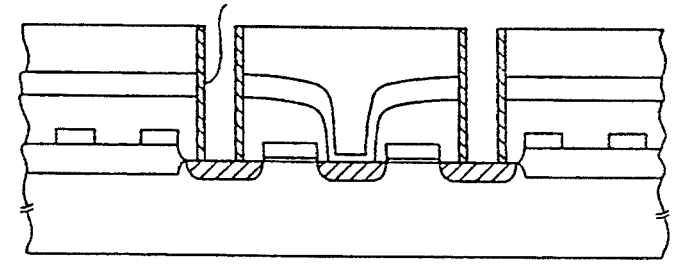
Figure 11:
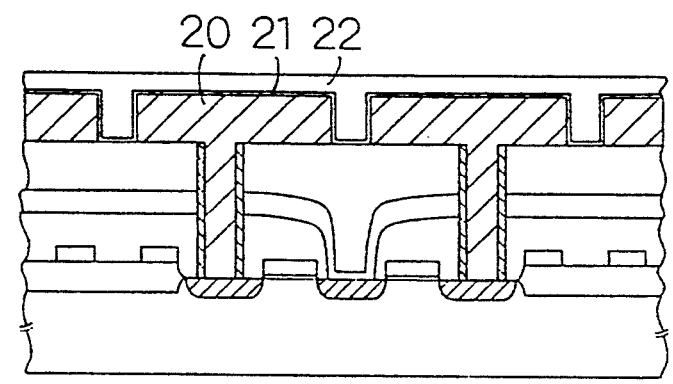

By reference to FIG. 11, a method of manufacturing the semiconductor memory device of this example is now described below.

Like the second example (see FIG. 7), formed on the p-type semiconductor substrate 1 are the ion diffused layer 2 composed of the drain 3 and the source 4, the isolation region 5 used for electrical insulation from the ion diffused layer 2, the word line 6, the gate insulation layer 7 between the drain 3 and the source 4, and the gate 8 on the gate insulation layer 7. The drain 3, the source 4, and the gate 8 together constitute the switching transistor 9. Then, the first dielectric layer 10, the bit line contact 11, the bit line 12, and the second dielectric layer 13 are formed, as shown in FIGS. 11(a) and (b).

As shown In FIG. 11(c), a resist pattern is so formed that its center lies off-center to the center line of the bit line 12 In plane, above the source 4. Thus, the resist pattern partly deviates from above the bit line 12. The second dielectric layer 13, formed by BPSG and NSG, is etched with $CHF_3$, $O_2$, and $N_2$ so that the bit line 12, of $WSi_{2.7}$, is exposed. Then, now with HBr, HCl, and $SF_6$, the deposited layers of $WSi_{2.7}$ and polysilicon are etched. The first dielectric layer 10, formed by BPSG, is etched with $CHF_3$ and $O_2$ to form the storage capacitor contact 18.

As shown in FIGS. 11(d) and (e), the sidewall passivation layer 19, the storage capacitor electrode 20, the capacitor insulation layer 21, and the plate electrode 22 are formed in the same way that they are formed in the second example (see FIG. 7).

In the third example, only a part of the storage capacitor contact 18 passes through the bit line 12, and the remaining part does not. As a result, the area of the bit line 12 next to the storage capacitor contact 18 through the sidewall passivation layer 19 of a very thin layer decreases (see FIG. 10). This causes the bit line capacity (i.e., the parasitic capacitance) for the storage capacity electrode 20 to decrease, compared to the second example.

Even for the first example where the storage capacitor electrode 20 is formed on the upper-level wires 14 and 16, it is possible to have the storage capacitor contact 18 pass through the upper-level wires 14 and 16, and to have, at a point where the storage capacitor contact 18 and the bit line 12 cross, only a part of the storage capacitor contact 18 run through the bit line 12 while having the remaining part, on the other hand, pass through outside the bit line 12. This presents an advantage that the bit line capacity for the storage capacitor electrode 20 can be decreased.

FOURTH EXAMPLE

Figure 12:
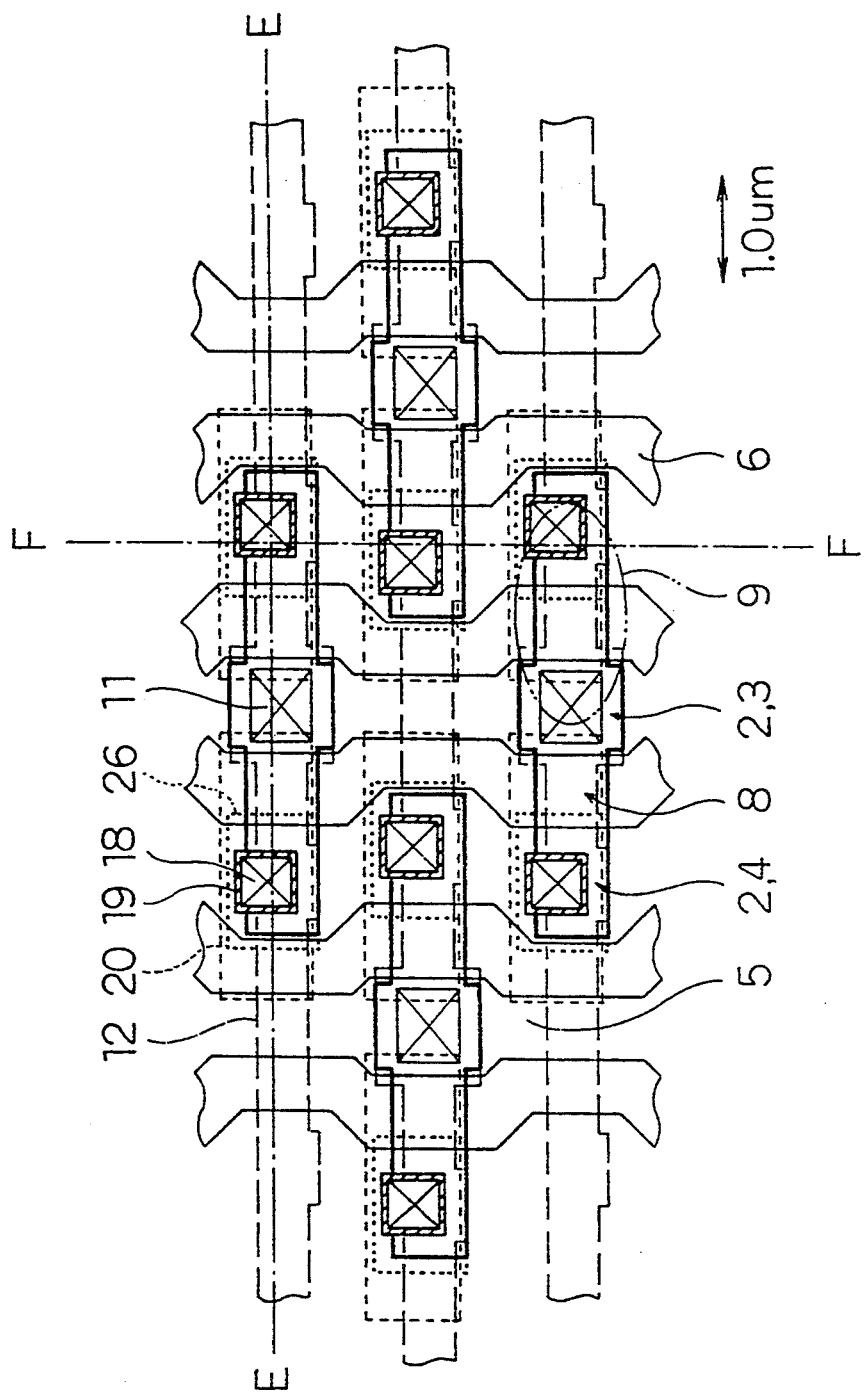
FIG. 12 is a schematic top view showing the layout of a semiconductor memory device of a fourth example of the present invention.
Figure 13:
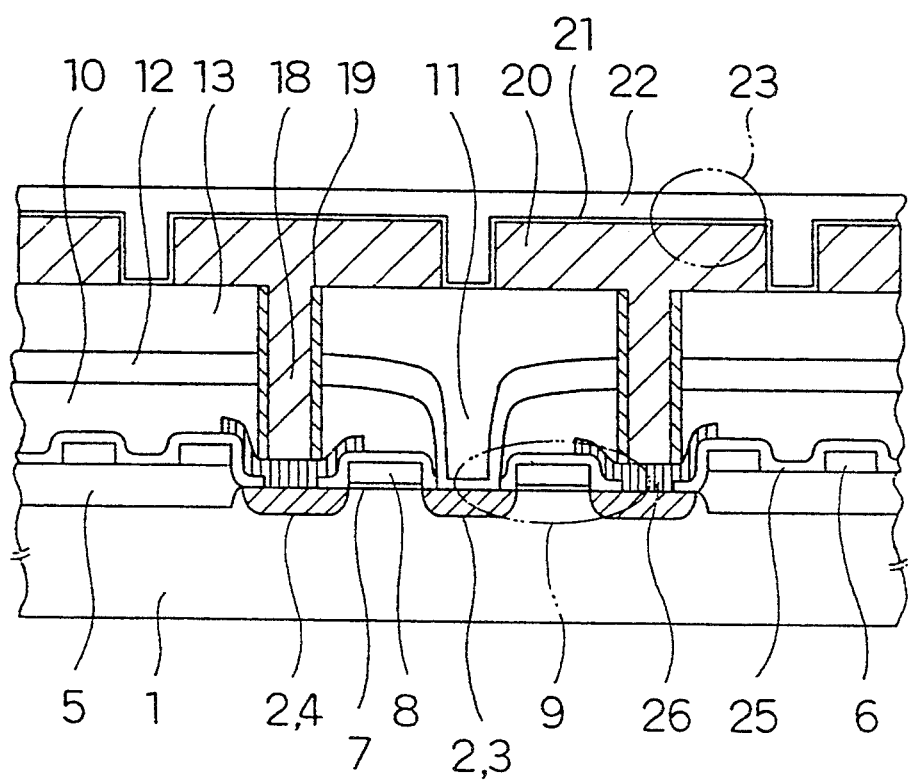
FIG. 13 is a cross sectional view through E—E of FIG. 12.
Figure 14:
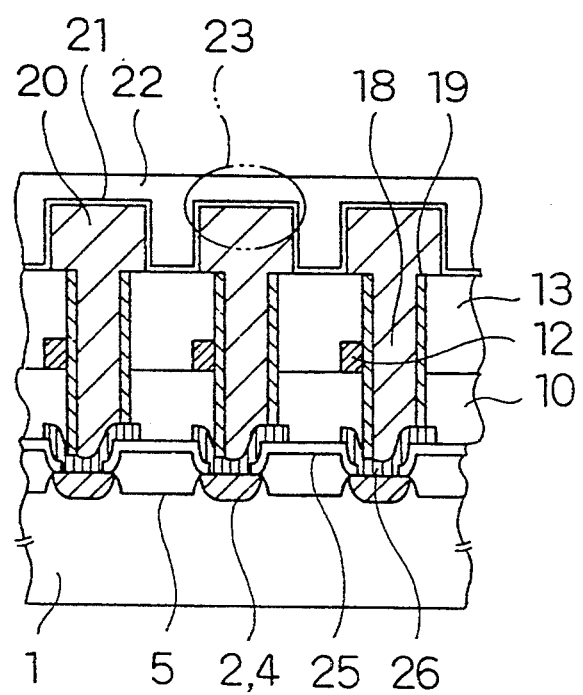
FIG. 14 is a cross sectional view through F—F of FIG. 12.

A fourth example of the invention is described below. FIG. 12 is a schematic top view showing the layout of a semiconductor memory device in accordance with the fourth example. FIG. 13 a cross sectional view through E—E of FIG. 12. FIG. 14 is a cross sectional view through F—F of FIG. 12. Like characters indicate like elements throughout the figures. Elements, indicated by the reference numerals 25 and 26, are an etching stopper formed by HTO and an extraction electrode, of n+ polysilicon, formed on the source 4.

The extraction electrode 26 is formed on the ion diffused layer 2, where the storage capacitor contact 18 is provided, through the etching stopper 25. The storage capacitor contact 18 is through the extraction electrode 26 connected to the ion diffused layer 2.

Figure 15:
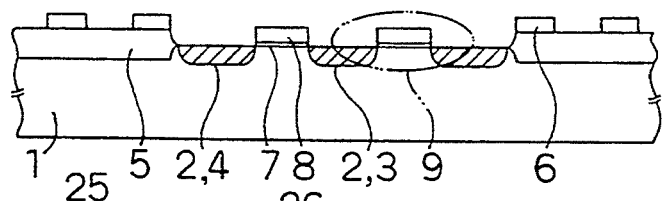
FIGS. 15a–15f illustrate the fabrication sequence of the semiconductor memory device of the fourth example of the invention.
Figure 15:
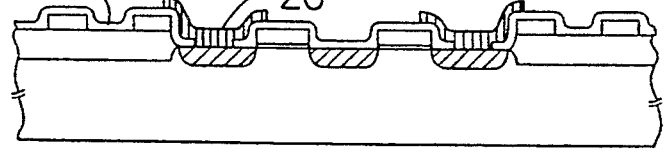
Figure 15:
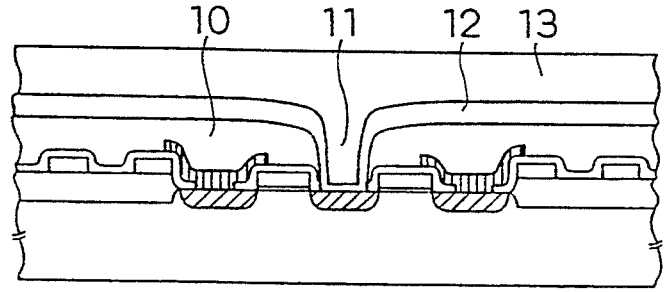
Figure 15:
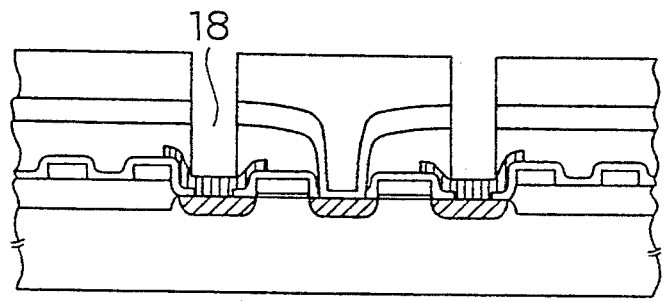
Figure 15:
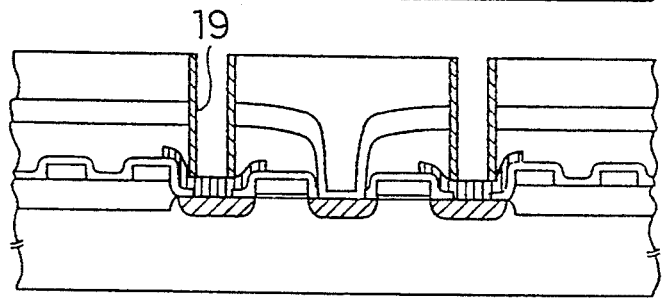
Figure 15:
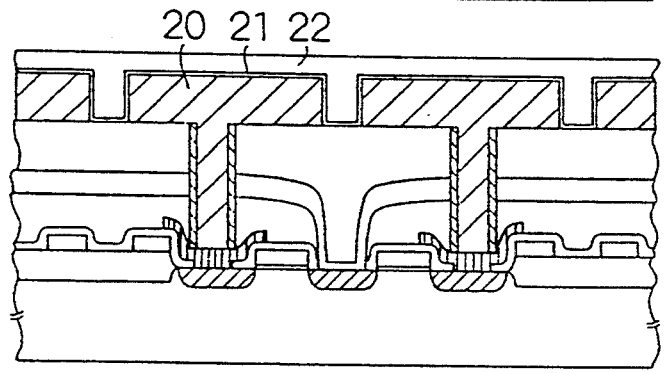

By making reference to FIG. 15, a method of manufacturing the semiconductor memory device of the fourth example is described.

Like the foregoing examples, as shown in FIG. 15(a), formed on the p-type semiconductor substrate 1 are the ion diffused layer 2 composed of the drain 3 and the source 4, the isolation region 5 used for electrical insulation from the ion diffused layer 2, the word line 6, the gate insulation layer 7 between the drain 3 and the source 4, and the gate 8 on the gate insulation layer 7. The drain 3, the source 4, and the gate 8 together constitute the switching transistor 9.

As shown in FIG. 15(b), a layer of HTO is deposited to a thickness of about 100 nm by means of an LPCVD to form the etching stopper 25. Then, a resist pattern is formed by a photolithographic process onto the source 4. The deposited layer of HTO on the source 4 is etched with $CHF_3$ and $O_2$. By means of an LPCVD, a layer of phosphorus-doped silicon is deposited to a thickness of about 150 nm. A resist pattern is formed on the deposited layer of phosphorus-doped silicon by a photolithographic process. With the resist pattern used as a mask, the deposited phosphorus-doped silicon is etched with gasses, HCl, HBr, and $O_2$ to form the extraction electrode 26.

As shown in FIG. 15(c), like the third example, the first dielectric layer 10, the bit line contact 11, the bit line 12, and the second dielectric layer 13 are formed.

As shown in FIG. 15(d), a resist pattern is so formed that its center lies off-center to the center line of the bit line 12 in plane, above the extraction electrode 26. Thus, the resist pattern partly deviates from above the bit line 12. The second dielectric layer 13, formed by BPSG and NSG, is etched with $CHF_3$, $O_2$, and $N_2$ so that the bit line 12, of $WSi_{2.7}$, is exposed. Then, now with using HBr, HCl, and $SF_6$, the deposited layers of $WSi_{2.7}$ and polysilicon are etched. Finally, the first dielectric layer 10, formed by BPSG, is etched with $CHF_3$ and $O_2$ to form the storage capacitor contact 18.

As shown in FIGS. 15(e) and (f), the sidewall passivation layer 19, the storage capacitor electrode 20, the capacitor insulation layer 21, and the plate electrode 22 are formed in the same way that they are formed in the third example.

In this example, the extraction electrode 26 is formed on the ion diffused layer 2 to which at least the storage capacitor contact 18 is connected. This allows of the formation of the storage capacitor contact 18 on the extraction electrode 26 greater than the ion diffused layer 2. Therefore, it is possible to greatly deviate the center of the storage capacitor contact 18 in plane from the center line of the bit line 12 in plane (see FIG. 14) to reduce the area of the bit line 12 next to the storage capacitor contact 18. The bit line capacity for the storage capacitor electrode 20 can be reduced as well. The target used in forming the storage capacitor contact 18 is enlarged so that the storage capacitor 28 can be connected to the ion diffused layer 2 positively. This facilitates the production of semiconductor memory devices.

Even for the semiconductor memory device as described in the first example where the storage capacitor electrode 20 is formed on the upper-level wires 14 and 16, by forming the extraction electrode 26 on the ion diffused layer 2 and by bringing the storage capacitor contact 18 into contact with the extraction electrode 26, the target used in forming the storage capacitor contact 18 can be enlarged. This results in positively connecting the storage capacitor 28 to the ion diffused layer 2 thereby facilitating the semiconductor memory device production.

FIFTH EXAMPLE

Figure 16:
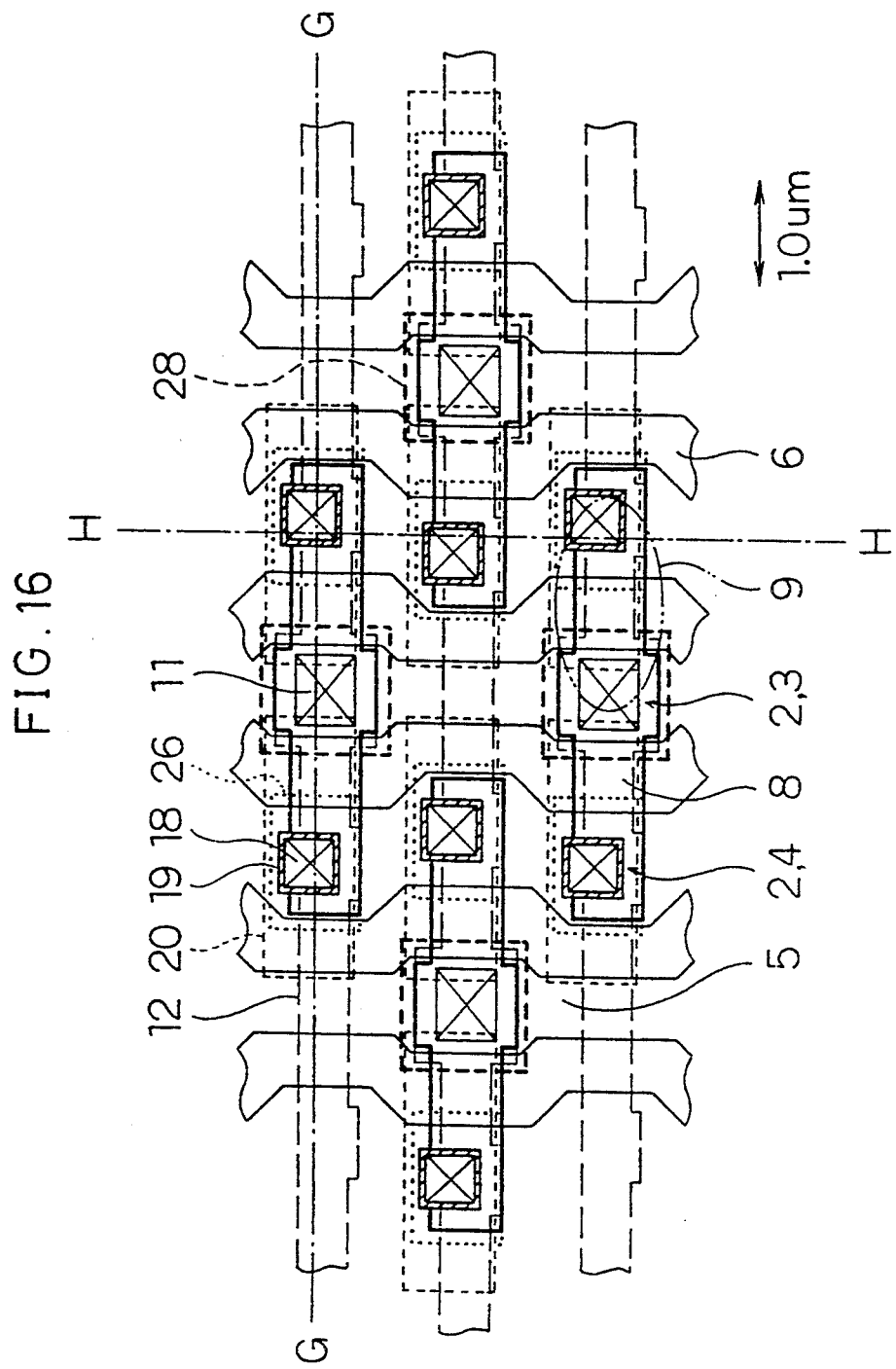
FIG. 16 is a schematic top view showing the layout of a semiconductor memory device of a fifth example of the present invention.
Figure 17:
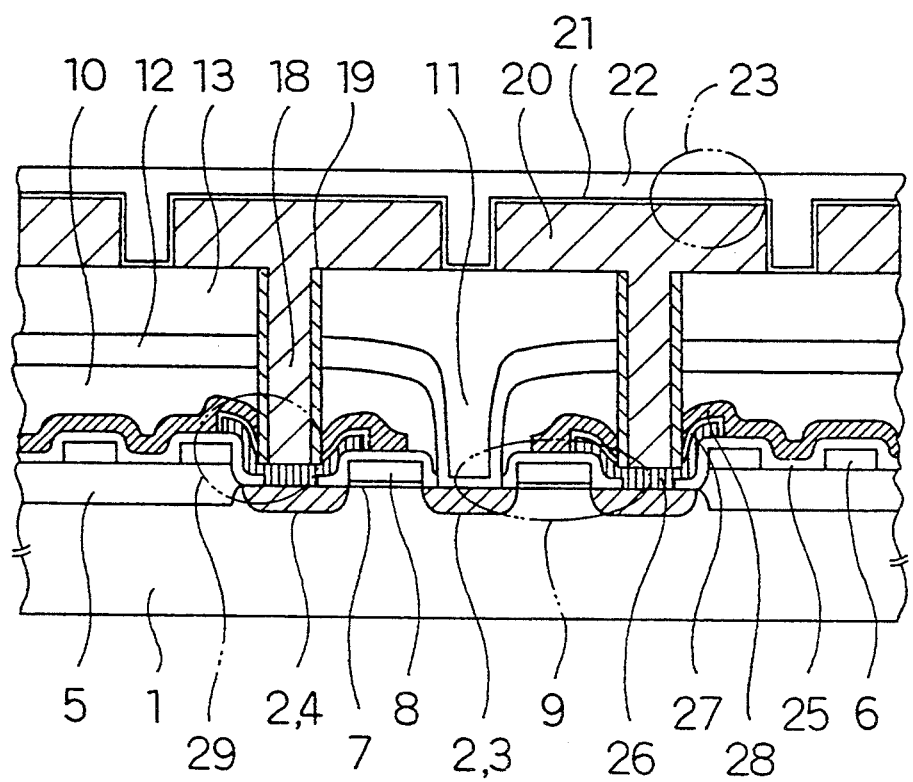
FIG. 17 is a cross sectional view through G—G of FIG. 16.
Figure 18:
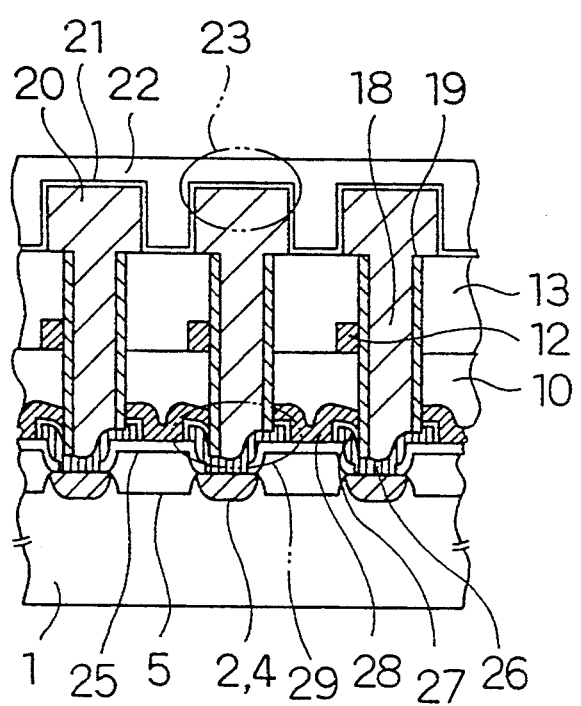
FIG. 18 is a cross sectional view through H—H of FIG. 16.

A fifth example of the invention is described below. FIG. 16 is a schematic top view showing the layout of a semiconductor memory device in accordance with the fourth example. FIG. 17 is a cross sectional view through G—G of FIG. 16. FIG. 18 is a cross sectional view through H—H of FIG. 16. Like characters indicate like elements throughout the figures. A lower-level capacitor insulation layer, of $SiO_2$ and $Si_3N_4$, is indicated by the reference numeral 27. A lower-level plate electrode, of phosphorus-doped silicon, is indicated by 28. A lower-level storage capacitor, comprised of the extraction electrode 26, the lower-level capacitor insulation layer 27, and the lower-level plate electrode 28, is indicated by 29. Formed on the extraction electrode 26 are the lower-level capacitor insulation layer 27 and the lower-level plate electrode 28. The storage capacitor contact 18 is so formed that it passes through the lower-level plate electrode 28 through the lower-level capacitor insulation layer 27. The lower-level storage capacitor 29 is additionally provided, besides the storage capacitor 28 made up of the extraction electrode 20, the capacitor insulation layer 21, and the plate electrode 22.

Figure 19:
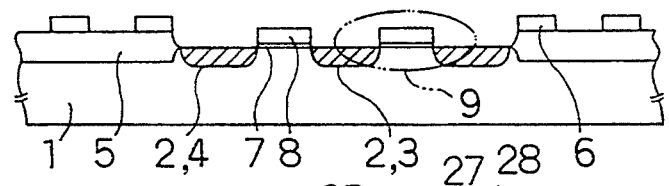
FIGS. 19a–19f illustrate the fabrication sequence of the semiconductor memory device of the fifth example of the invention.
Figure 19:
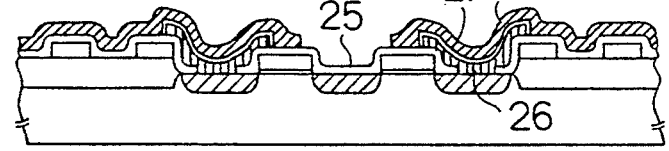
Figure 19:
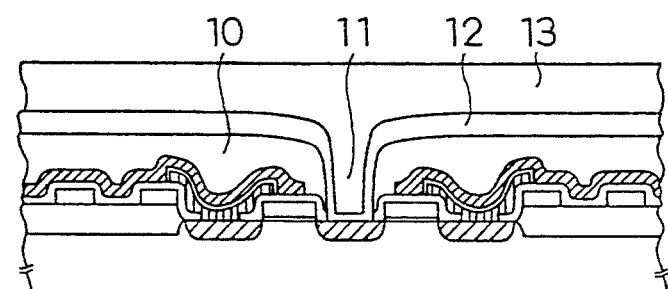
Figure 19:
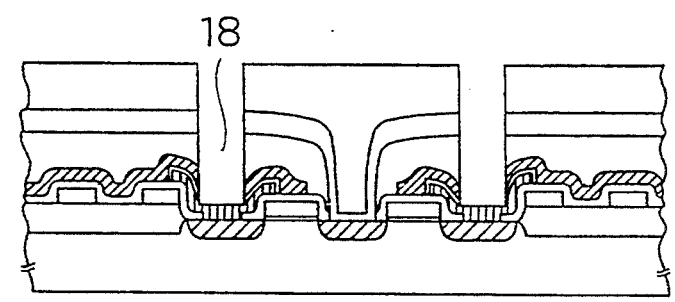
Figure 19:
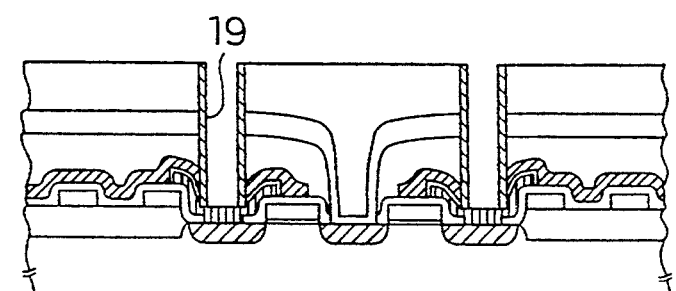
Figure 19:
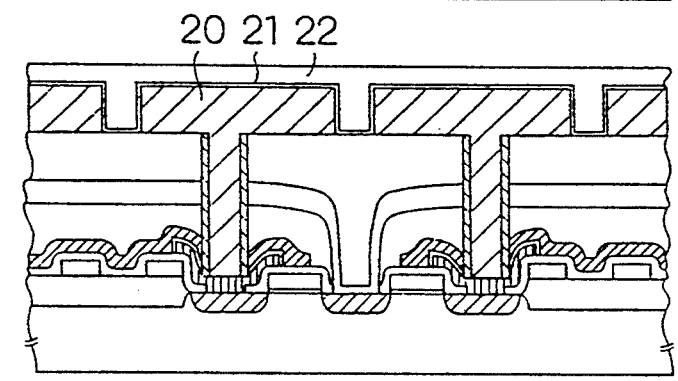
Figure 20:
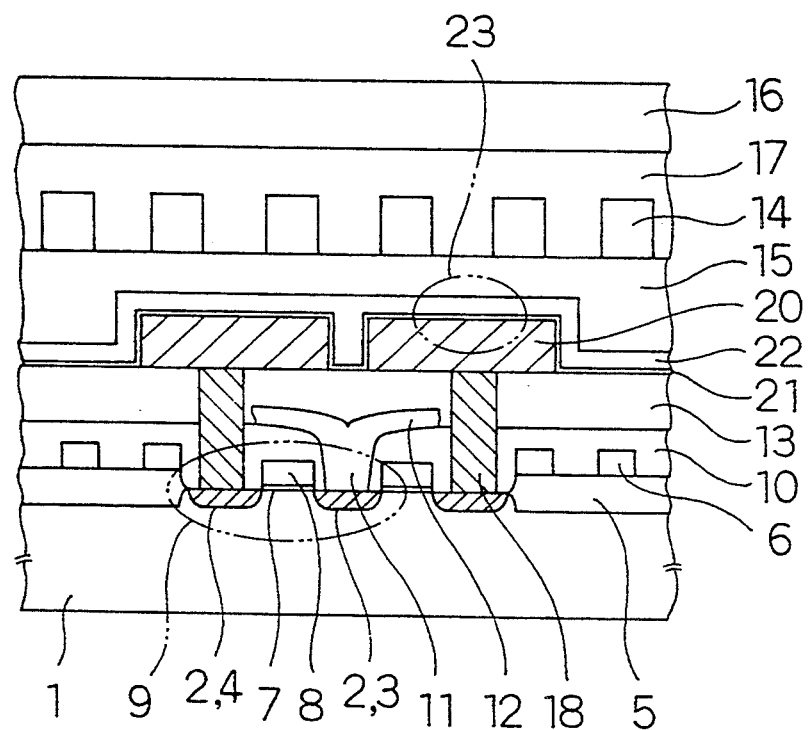
FIG. 20 illustrates, in cross section, the organization of a conventional semiconductor memory device with a memory cell of the BLUSC organization.
Figure 21:
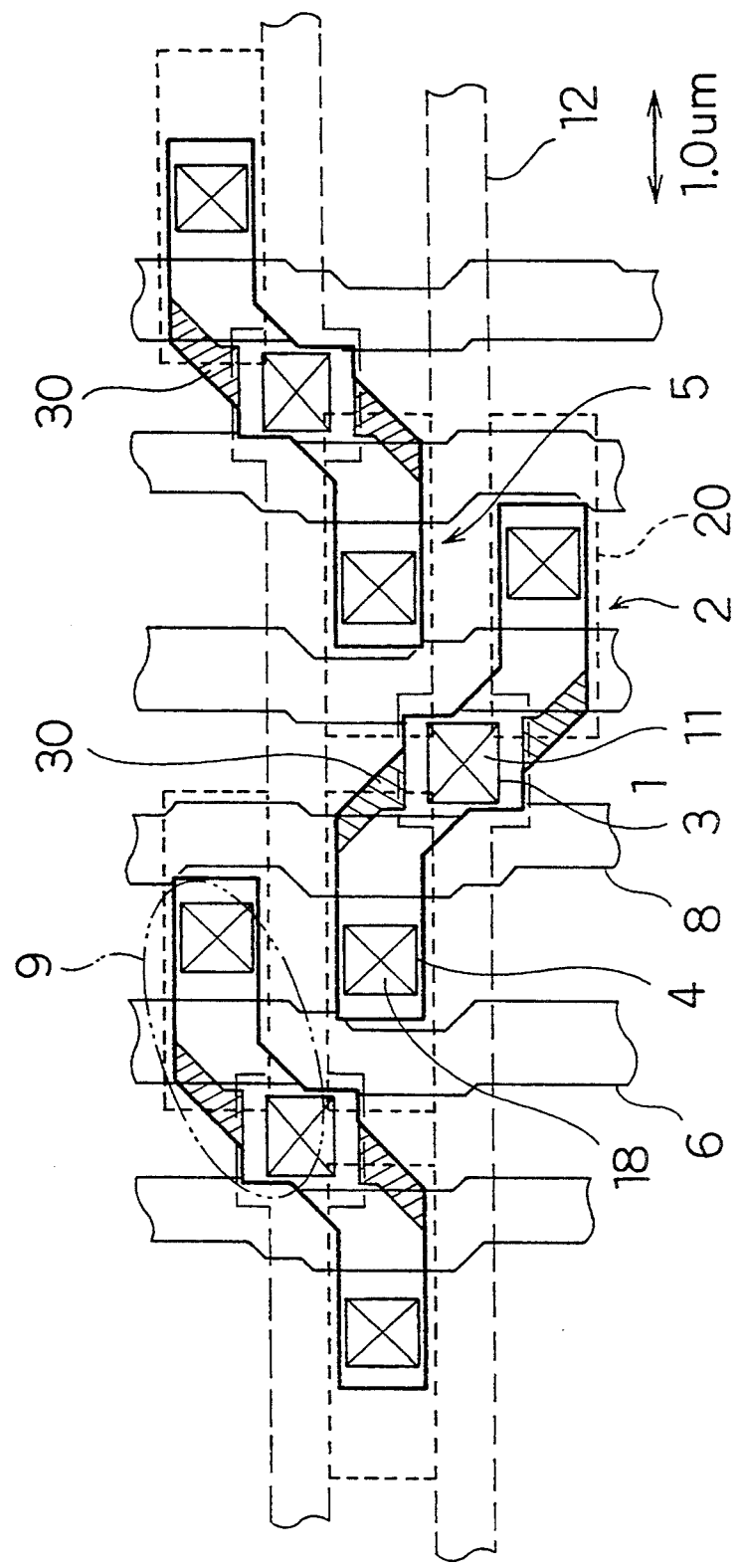
FIG. 21 illustrates, in plane, the organization of a conventional semiconductor memory device with a memory cell of the BLUSC organization.
Figure 22:
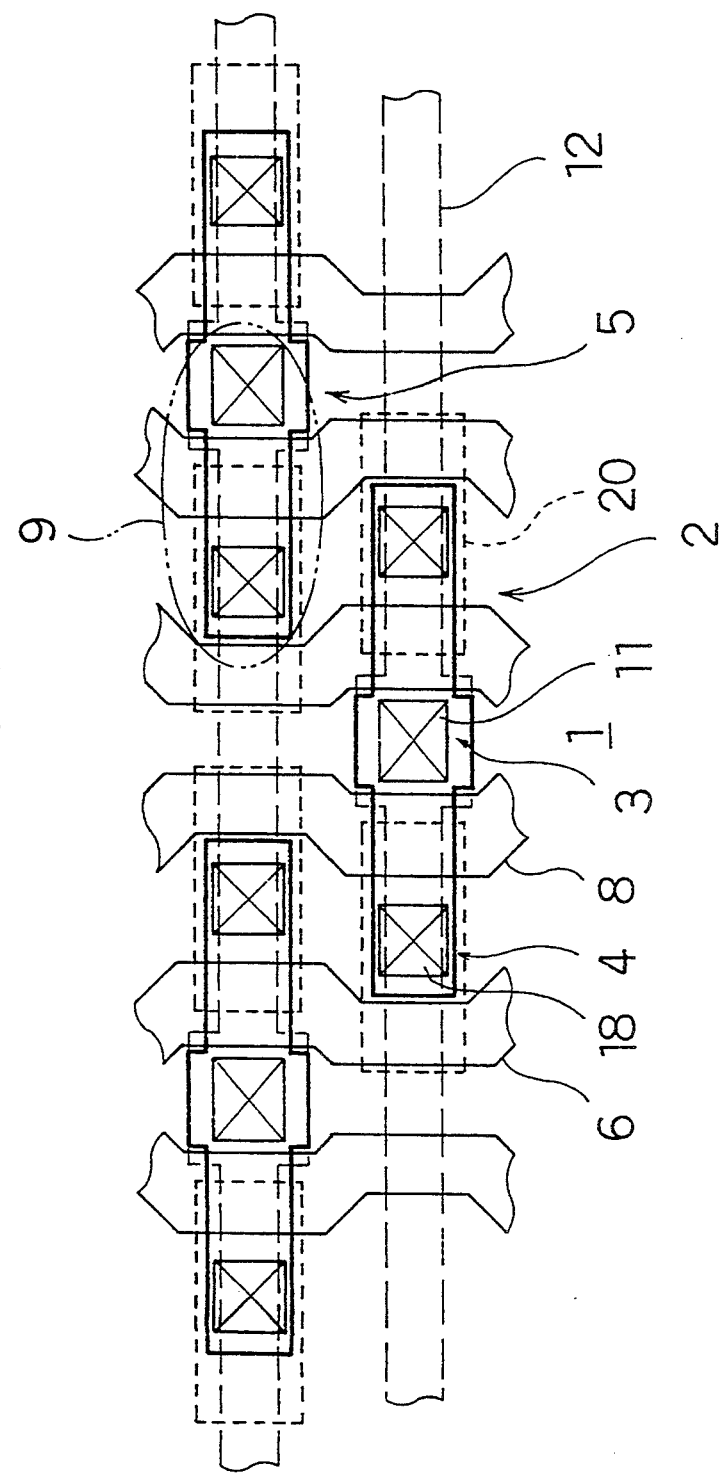
FIG. 22 illustrates, in plane, the organization of a conventional semiconductor memory device with the BLOSC organization.

A method of manufacturing the semiconductor memory device of the fifth example is described by reference to FIG. 19.

As shown in FIG. 19(a), like the foregoing examples, formed on the p-type semiconductor substrate 1 are the ion diffused layer 2 composed of the drain 8 and the source 4, the isolation region 5 used for electrical insulation from the ion diffused layer 2, the word line 8, the gate insulation layer 7 between the drain 8 and the source 4, and the gate 8 on the gate insulation layer 7. The drain 8, the source 4, and the gate 8 together constitute the switching transistor 9.

As shown in FIG. 19(b), a layer of HTO is deposited to a thickness of about 100 nm by means of an LPCVD to form the etching stopper 25. Then, a resist pattern is defined by a photolithographic process on the source 4. The deposited layer of HTO on the source 4 is etched using gasses, $CHF_3$ and $O_2$. By means of an LPCVD, a layer of phosphorus-doped silicon is deposited to a thickness of about 150 nm. A resist pattern is formed by a photolithographic process. With the resist pattern used as a mask, the deposited layer of phosphorus-doped silicon is etched using gasses, HCl, HBr, and $O_2$ to form the extraction electrode 28. A nitride film with a thickness of about 8.5 nm is formed by an LPCVD, which is thermal-oxidized at a temperature of about 850° C. for about 20 minutes to form the lower-level capacitor insulation layer 27. A phosphorus-doped silicon layer is deposited to a thickness of about 250 nm by means of an LPCVD. A resist pattern is formed over the drain 4. Using the resist pattern as a mask, the deposited layer of phosphorus-doped silicon lying over the drain 4 is etched to form the lower-level plate electrode 28.

As shown in FIG. 19(c), like the fourth example, the first dielectric layer 10, the bit line contact 11, the bit line 12, and the second dielectric layer 13 are formed.

As shown in FIG. 19(d), a resist pattern is so formed that its center lies off-center to the center line of the bit line 12 in plane, above the extraction electrode 26. Thus, the resist pattern partly deviates from above the bit line 12. The second dielectric layer 13, formed by BPSG and NSG, is etched with $CHF_3$, $O_2$, and $N_2$ so that the bit line 12, of $WSi_{2.7}$, is exposed. Then, with HBr, HCl, and $SF_6$, the deposited layers of $WSi_{2.7}$ and polysilicon are etched. The first dielectric layer 10, formed by BPSG, is etched with $CHF_3$ and $O_2$ so that the lower-level plate electrode 28, of phosphorus-doped silicon is exposed. Then, with HCl, HBr, and $O_2$, the lower-level plate electrode 28 (of phosphorus-doped silicon), the lower-level capacitor insulation layer 27 (of $SiO_2$ and $Si_3N_4$), a part of the extraction electrode 26 (of phosphorus-doped silicon) are all etched to form the storage capacitor contact 18.

As shown in FIGS. 19(e) and (f), the sidewall passivation layer 19, the storage capacitor electrode 20, the capacitor insulation layer 21, and the plate electrode 22, of the storage capacitor contact 18, are formed in the same way that they are formed in the fourth example.

In the fifth example, the lower-level capacitor insulation layer 27 and the lower-level plate electrode 28 are formed on the extraction electrode 26, and the storage capacitor contact 18 is so formed that it passes through the lower-level plate electrode 28 through the lower-level capacitor insulation layer 27 whereby the lower-level storage capacitor 29 is made up of the extraction electrode 26, the lower-level capacitor insulation layer 27, and the lower-level plate electrode 28. Thus, besides the storage capacitor electrode 20, the extraction electrode 26 serves also as a storage capacitor. This results in a greater storage capacity.

For the semiconductor memory device as described in the first example where the storage capacitor electrode 20 is formed on the upper-level wires 14 and 16, it is possible to facilitate the production of semiconductor memory devices while at the same time having the extraction electrode 26 serve also as a storage capacitor so as to increase the capacity of storage, by establishing the lower-layer connection of the storage capacitor contact 18 wherein the extraction electrode 26 is formed on the ion diffused layer 2, the lower-level capacitor insulation layer 27 and the lower-level plate electrode 28 are formed on the extraction electrode 26, and the storage capacitor contact 18 passes through the lower-level plate electrode 28 through the lower-level capacitor insulation layer 27.

It is understood that various other modification to the above-described method and device will become evident to those skilled in the art. For that reason the arrangement described herein is for illustrative purposes only and is not to be considered restrictive.

The invention claimed is:

1. A semiconductor memory device comprising:
   a switching transistor that is formed in a semiconductor substrate having an ion diffused layer near a surface of the semiconductor substrate, the ion diffused layer forming a source and a drain of the switching transistor,
   a bit line that is formed over the switching transistor and is directly coupled to a part of the ion diffused layer of the switching transistor; and
   a storage capacitor formed over the bit line, said storage capacitor comprising a storage capacitor contact which couples said storage capacitor to the ion diffused layer of the switching transistor,
   wherein the storage capacitor contact is formed such that the storage capacitor contact passes through the bit line.

2. A semiconductor memory device comprising:
   a switching transistor that is formed in a semiconductor substrate having an ion diffused layer near a surface of the semiconductor substrate, the ion diffused layer forming a source and a drain of the switching transistor;
   a bit line that is formed over the switching transistor and is directly coupled to a part of the ion diffused layer of the switching transistor; and
   a storage capacitor formed over the bit line, said storage capacitor comprising a storage capacitor contact which couples said storage capacitor to the ion diffused layer of the switching transistor,
   wherein the storage capacitor contact is formed such that, at a point where the storage capacitor contact and the bit line cross, only a portion of the storage capacitor contact passes through the bit line, while the remaining portion of the storage capacitor contact passes outside the bit line.

* * * * *